United States Patent
Dong et al.

(10) Patent No.: US 11,250,108 B2
(45) Date of Patent: Feb. 15, 2022

(54) MATRIX PROCESSING METHOD AND APPARATUS, AND LOGIC CIRCUIT

(71) Applicant: HUAWEI TECHNOLOGIES CO., LTD., Guangdong (CN)

(72) Inventors: Zhenjiang Dong, Shenzhen (CN); Chio In Ieong, Shenzhen (CN); Hu Liu, Shenzhen (CN); Hai Chen, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/869,837

(22) Filed: May 8, 2020

(65) Prior Publication Data
US 2020/0265108 A1    Aug. 20, 2020

Related U.S. Application Data

(63) Continuation of application No. PCT/CN2018/098993, filed on Aug. 6, 2018.

(51) Int. Cl.
*G06F 17/16* (2006.01)
*G06F 7/42* (2006.01)
*H03K 19/20* (2006.01)
*H03M 7/30* (2006.01)

(52) U.S. Cl.
CPC ............... *G06F 17/16* (2013.01); *G06F 7/42* (2013.01); *H03K 19/20* (2013.01); *H03M 7/30* (2013.01)

(58) Field of Classification Search
CPC .......... G06F 17/16; G06F 7/42; H03K 19/20; H03M 7/30

USPC ................................................ 708/520, 607
See application file for complete search history.

(56) References Cited

U.S. PATENT DOCUMENTS

| | | | |
|---|---|---|---|
| 5,905,666 | A | 5/1999 | Hoffman et al. |
| 6,041,404 | A | 3/2000 | Roussel et al. |
| 6,970,994 | B2 | 11/2005 | Abdallah et al. |
| 8,364,739 | B2 | 1/2013 | Baskaran et al. |
| 2007/0198621 | A1 | 8/2007 | Lumsdaine et al. |
| 2008/0126467 | A1 | 5/2008 | Ghuloum |
| 2009/0282207 | A1 | 11/2009 | Burkart et al. |
| 2010/0235415 | A1 | 9/2010 | Ikada |

(Continued)

FOREIGN PATENT DOCUMENTS

| | | |
|---|---|---|
| CN | 1158613 C | 7/2004 |
| CN | 102033854 A | 4/2011 |

(Continued)

OTHER PUBLICATIONS

Machine Translate CN103336758A, year 2013.*

(Continued)

*Primary Examiner* — Tan V Mai

(57) ABSTRACT

A matrix processing method includes: determining a quantity of non-zero elements in a to-be-processed matrix, where the to-be-processed matrix is a one-dimensional matrix; generating a distribution matrix of the to-be-processed matrix, where the distribution matrix is used to indicate a position of a non-zero element in the to-be-processed matrix; combining the quantity of non-zero elements, values of all non-zero elements in the to-be-processed matrix arranged sequentially, and the distribution matrix, to obtain a compressed matrix of the to-be-processed matrix.

12 Claims, 14 Drawing Sheets

(56) References Cited

U.S. PATENT DOCUMENTS

| | | | |
|---|---|---|---|
| 2010/0306300 | A1 | 12/2010 | Lu et al. |
| 2011/0078226 | A1 | 3/2011 | Baskaran et al. |
| 2011/0307685 | A1* | 12/2011 | Song .............. G06F 17/10 |
| | | | 712/16 |
| 2012/0278376 | A1 | 11/2012 | Bakos |
| 2014/0108481 | A1 | 4/2014 | Davis et al. |
| 2016/0179750 | A1 | 6/2016 | Zhou |
| 2016/0259826 | A1 | 9/2016 | Acar et al. |
| 2017/0293659 | A1 | 10/2017 | Huang |
| 2017/0371839 | A1 | 12/2017 | Zhou |
| 2018/0121388 | A1 | 5/2018 | Rennich |
| 2018/0129935 | A1 | 5/2018 | Kim et al. |
| 2018/0131946 | A1* | 5/2018 | Lee .............. G06K 9/6256 |
| 2018/0210862 | A1 | 7/2018 | Akerib |
| 2019/0266217 | A1* | 8/2019 | Arakawa .......... G06F 9/30036 |
| 2021/0065005 | A1* | 3/2021 | Zhu .............. G06F 17/16 |

FOREIGN PATENT DOCUMENTS

| | | | |
|---|---|---|---|
| CN | 102141976 | A | 8/2011 |
| CN | 102436438 | A | 5/2012 |
| CN | 102522983 | A | 6/2012 |
| CN | 103336758 | A * | 10/2013 |
| CN | 103336758 | A | 10/2013 |
| CN | 104636273 | A | 5/2015 |
| CN | 105593843 | A | 5/2016 |
| CN | 106846363 | A | 6/2017 |
| CN | 107229967 | A | 10/2017 |
| CN | 107239824 | A | 10/2017 |
| CN | 107562694 | A | 1/2018 |
| CN | 107689224 | A | 2/2018 |
| CN | 107909148 | A | 4/2018 |
| CN | 107944555 | A | 4/2018 |
| CN | 107977704 | A | 5/2018 |
| CN | 107992329 | A | 5/2018 |
| CN | 108268422 | A | 7/2018 |
| GB | 2574060 | A | 11/2019 |
| WO | 2014167730 | A1 | 10/2014 |

OTHER PUBLICATIONS

Dongyoung Kim et al., "ZeNA: Zero-Aware Neural Network Accelerator", Copublished by the IEEE CEDA, IEEE CASS, IEEE SSCS, and TTTC, Feb. 2, 2018, total 8 pages.

Aydin Buluc et al, "Reduced-Bandwidth Multithreaded Algorithms for Sparse Matrix-Vector Multiplication", 2011 IEEE International ParallelandDistributed Processing Symposium, total 13 pages.

Shijing Zhang et al, "Cambricon-X: An Accelerator for Sparse Neural Networks", 2016 49th Annual IEEE/ACM International Symposium on Microarchitecture (MICRO), Dec. 15, 2016, total 12 pages.

Xing Liu et al, "Efficient Sparse Matrix-Vector Multiplication on x86-Based Many-Core Processors", Proceedings of the 27th international ACM conference on International conference on supercomputing, Jun. 2013, total 10 pages.

Yang Wang-dong et al., Quasi-diagonal Matrix Hybrid Compression Algorithm and Implementation for SpMV on GPU. Computer Science, vol. 47, No. 7, Jul. 2014, 7 pages.

Jiasen Huang et al., No Zero Padded Sparse Matrix-Vector Multiplication on FPGAs. 2014 International Conference on Field-Programmable Technology (FPT), Apr. 9, 2015, 2 pages.

Angshuman Parashar et al. SCNN: An Accelerator for Compressed-sparse Convolutional Neural Networks, ISCA '17, Jun. 24-28, 2017. total 14 pages.

Patrick Judd et al. Cnvlutin2: Ineffectual-Activation-and-Weight-Free Deep Neural Network Computing, arXiv:1705.00125v1 [cs.LG] Apr. 29, 2017. total 6 pages.

Song Han et al. EIE: Efficient Inference Engine on Compressed Deep Neural Network, arXiv:1602.01528v2 [cs.CV] May 3, 2016, total 12 pages.

Xinhai Chen et al, An efficient SIMD compression format for sparse matrix-vector multiplication, 2018 John Wiley and Sons, Ltd., total 11 pages.

Xing Liu et al, Efficient Sparse Matrix-Vector Multiplication on x86-Based Many-Core Processors, ICS 13, Jun. 10-14, 2013, Eugene, Oregon, USA, total 10 pages.

Jiang Chuan-qun et al, Improved algorithm of sparse matrix multiplying, Computer Engineering and Applications, 2009, with an English abstract, total 3 pages.

Rakshith Kunchum et al, On Improving Performance of Sparse Matrix-Matrix Multiplication on GPUs, ICS 17, Chicago, IL, USA, 2017 ACM, total 11 pages.

Lei Jie et al, Survey of Deep Neural Network Model Compression, Journal of Software, vol. 29, No. 2, Feb. 2018, with an English abstract, total 16 pages.

Tian Liang et al, The Research on Optimizing Sparse Matrix Computation Based on GPU, A Thesis Submitted in artial Fulfillment of the Requirements for the Degree of Master of Engineering, Feb. 2012, with an English abstract, total 48 pages.

* cited by examiner

| Quantity of non-zero elements | Sequentially arranged non-zero elements | Distribution matrix |

| Distribution matrix | Quantity of non-zero elements | Sequentially arranged non-zero elements |

| Sequentially arranged non-zero elements | Distribution matrix | Quantity of non-zero elements |

MATRIX PROCESSING METHOD AND APPARATUS, AND LOGIC CIRCUIT

CROSS-REFERENCE TO RELATED APPLICATIONS

This application is a continuation of International Application No. PCT/CN2018/098993, filed on Aug. 6, 2018, the disclosure of which is hereby incorporated by reference in its entirety.

TECHNICAL FIELD

This application relates to the field of data processing technologies, and in particular, to a matrix processing method and apparatus, and a logic circuit.

BACKGROUND

A matrix is an operation tool frequently used in scientific calculation and is widely applied to engineering. A sparse matrix is a special example of the matrix, and is a matrix with only a few non-zero elements in the matrix. Because the sparse matrix includes a large quantity of zero-valued elements, a large quantity of unnecessary operations may be caused during a matrix operation in a conventional matrix storage manner.

In the prior art, to improve operation efficiency of a sparse matrix, a more valid sparse-matrix processing manner is usually used to compress the sparse matrix. At present, a mainstream sparse-matrix processing manner is compressed row storage (CSR). A compressed matrix obtained after CSR processing is performed on the sparse matrix stores a non-zero element in the sparse matrix by using a row offset, an element column number, and an element value. The element value and the element column number respectively represent an element and a column number of the element in the matrix, and the row offset represents a start offset position, in a value, of the first element in a row. Therefore, when an operation is performed on the sparse matrix, a related operation may be directly performed on a compressed matrix obtained after compression that replaces the sparse matrix existing before compression, so that when a convolution operation is performed on the sparse matrix, invalid calculation related to multiplying an element 0 in the matrix and an element in a same position as that in a corresponding sparse matrix to obtain a value 0 is reduced. In addition, when a convolution operation is performed on two CSR compressed matrices, quantities of non-zero elements in original matrices corresponding to the two CSR compressed matrices are usually different, and it cannot be specified that a convolution operation needs to be performed between a non-zero element in one CSR compressed matrix and a specific non-zero element in the other CSR compressed matrix. Therefore, before the convolution operation is performed on the two CSR compressed matrices, some values 0 in the original matrices corresponding to the CSR compressed matrices further need to be restored, to ensure that two CSR compressed matrices with a same quantity of dimensions are obtained after the non-zero elements in the two CSR compressed matrices are supplemented with the value 0 to help alignment, so that products of elements in every two same positions in the two matrices with a same quantity of dimensions can be accumulated to obtain a result of performing the convolution operation on the two matrices.

According to an existing matrix processing method, when a convolution operation is performed on a compressed sparse matrix, some elements 0 further need to be added to perform element alignment. Therefore, when the convolution operation is performed on the compressed sparse matrix, an invalid operation on an element 0 is not completely avoided, resulting in relatively low efficiency of the existing matrix processing method.

SUMMARY

This application provides a matrix processing method and apparatus, and a logic circuit. A non-zero element in a to-be-processed matrix and a distribution matrix used to indicate a position of the non-zero element are determined, and a quantity of non-zero elements, sequentially arranged non-zero elements, and the distribution matrix are combined into a compressed matrix, so that when a matrix-level operation such as a convolution operation, a multiply-add operation, a multiply-subtract operation, a divide-add operation, or a divide-subtract operation is performed on the sparse matrix, the operation can be performed on the compressed matrix that replaces the sparse matrix to obtain an operation result of the sparse matrix, so as to avoid invalid calculation related to a zero element and improve efficiency of the matrix processing method.

A first aspect of this application provides a matrix processing method, including:

determining a quantity of non-zero elements in a to-be-processed matrix, where the to-be-processed matrix is a one-dimensional matrix;

generating a distribution matrix of the to-be-processed matrix, where the distribution matrix is used to indicate a position of a non-zero element in the to-be-processed matrix; and combining the quantity of non-zero elements, values of all non-zero elements in the to-be-processed matrix arranged sequentially, and the distribution matrix, to obtain a compressed matrix of the to-be-processed matrix.

According to the matrix processing method provided in this embodiment, the non-zero element in the to-be-processed matrix and the distribution matrix used to indicate the position of the non-zero element can be determined, and the quantity of non-zero elements, the sequentially arranged non-zero elements, and the distribution matrix are combined into the compressed matrix. For the compressed matrix obtained by using the matrix processing method in this embodiment, when a matrix-level operation such as a convolution operation, a multiply-add operation, a multiply-subtract operation, a divide-add operation, or a divide-subtract operation is performed on the to-be-processed matrix, the operation is performed on the compressed matrix that replaces the to-be-processed matrix, to improve storage efficiency and operation efficiency of the processor for the to-be-processed matrix.

In an embodiment of the first aspect of this application, the distribution matrix is a one-dimensional matrix, and all elements in the to-be-processed matrix have a one-to-one correspondence with elements in the distribution matrix that are in same positions as the elements in the to-be-processed matrix; and the generating a distribution matrix of the to-be-processed matrix includes:

sequentially scanning the elements in the to-be-processed matrix; and when a scanned element is non-zero, setting a value of an element, corresponding to the scanned element, in the distribution matrix to 1; or when a value of the scanned element is 0, setting a value of the element, corresponding to the scanned element, in the distribution matrix to 0.

In the matrix processing method provided in this embodiment, a distribution matrix that has a same quantity of dimensions as the to-be-processed matrix and whose elements are in a one-to-one correspondence with elements in same positions is used to indicate whether an element in the to-be-processed matrix is a zero element. More specifically, the to-be-processed matrix is scanned for the elements, a constant 1 in the distribution matrix is used to indicate a non-zero element in the to-be-processed matrix, and a constant 0 is used to indicate a zero element in the to-be-processed matrix, so that during matrix processing, distribution of the zero element and the non-zero element in the to-be-processed matrix can be determined by using a simpler distribution matrix. Particularly, when there is a relatively large quantity of elements of an element in the to-be-processed matrix, in this embodiment, distribution of the zero element and the non-zero element in the to-be-processed matrix may be identified by using constants 0 and 1 each with a quantity of elements of only 1 bit. Therefore, there is no need to scan a to-be-processed matrix with a relatively large quantity of elements when an operation is performed on the to-be-processed matrix. This saves bandwidth for reading data during matrix processing.

In an embodiment of the first aspect of this application, there are N elements in the to-be-processed matrix and M non-zero elements in the to-be-processed matrix, and correspondingly, there are N elements in the distribution matrix, M elements whose values are 1 in the distribution matrix, and (M+N+1) elements in the compressed matrix, where N is a positive integer, M is a non-negative integer, and M is less than or equal to N.

According to the matrix processing method provided in this embodiment, a quantity of elements in the compressed matrix is more specifically limited, so that the compressed matrix of the one-dimensional matrix includes only the (M+N+1) elements including one non-zero element, M non-zero elements, and N elements in the distribution matrix. Therefore, in this embodiment, an operation performed on the compressed matrix that replaces the to-be-processed matrix can be completely equivalent to an operation performed on the to-be-processed matrix existing before compression. This ensures that a result obtained by calculating the compressed matrix is the same as a result obtained by calculating the to-be-processed matrix.

In an embodiment of the first aspect of this application, the to-be-processed matrix includes a first to-be-processed matrix and a second to-be-processed matrix. A quantity of elements in the first to-be-processed matrix is the same as a quantity of elements in the second to-be-processed matrix, and correspondingly, the distribution matrix includes a first distribution matrix and a second distribution matrix. The method further includes:

obtaining a target value based on the first distribution matrix, the second distribution matrix, non-zero elements in the first to-be-processed matrix, and non-zero elements in the second to-be-processed matrix, where the target value is the same as a result of summing products of each element in the first to-be-processed matrix with an element in the second to-be-processed matrix that is in a same position as the element in the first to-be-processed matrix.

In the matrix processing method provided in this embodiment, a first compressed matrix of the first to-be-processed matrix on which an operation needs to be performed and a second compressed matrix of the second to-be-processed matrix on which an operation needs to be performed are separately calculated, and an operation is performed on distribution matrices and non-zero elements that are in the first compressed matrix and the second compressed matrix and that replace the first to-be-processed matrix and the second to-be-processed matrix, to obtain operation results of the first to-be-processed matrix and the second to-be-processed matrix, so as to improve storage efficiency and operation efficiency of the processor for the first to-be-processed matrix and the second to-be-processed matrix.

In an embodiment of the first aspect of this application, the obtaining a target value based on the first distribution matrix, the second distribution matrix, non-zero elements in the first to-be-processed matrix, and non-zero elements in the second to-be-processed matrix includes:

generating a first non-zero element matrix constructed by sequentially obtaining the non-zero elements in the first to-be-processed matrix, and a second non-zero element matrix constructed by sequentially obtaining the non-zero elements in the second to-be-processed matrix, and wherein the obtaining a target value based on the first distribution matrix, the second distribution matrix, non-zero elements in the first to-be-processed matrix, and non-zero elements in the second to-be-processed matrix comprises:

constructing a first mask matrix by sequentially obtaining first target elements from the second distribution matrix according to the first distribution matrix, wherein the first target elements are obtained from the same positions in the second distribution matrix as positions of elements whose values are 1 in the first distribution matrix;

constructing a first reduced matrix by sequentially obtaining first valid elements from the first non-zero element matrix according to the first mask matrix, wherein the first valid elements are obtained from the same positions in the first non-zero element matrix as positions of elements whose values are 1 in the first mask matrix;

constructing a second mask matrix by sequentially obtaining second target elements from the first distribution matrix according to the second distribution matrix, wherein the second target elements are obtained from the same positions in the first distribution matrix as positions of elements whose values are 1 in the second distribution matrix;

constructing a second reduced matrix by sequentially obtaining second valid elements from the second non-zero element matrix according to the second mask matrix, wherein the second valid elements are obtained from the same positions in the second non-zero element matrix as positions of elements whose values are 1 in the second mask matrix; and obtaining the target value by summing products of each element in the first reduced matrix with an element in the second reduced matrix that is in a same position as the element in the first reduced matrix.

In the matrix processing method provided in this embodiment, a convolution operation can be performed on the first compressed matrix and the second compressed matrix that respectively replace the first to-be-processed matrix and the second to-be-processed matrix, to obtain the target value as a result of performing the convolution operation on the first to-be-processed matrix and the second to-be-processed matrix. In addition, in a process of calculating the first compressed matrix and the second compressed matrix, the first mask matrix and the second mask matrix can be determined by using the first distribution matrix and the second distribution matrix, the first reduced matrix and the second reduced matrix are finally determined based on the first mask matrix and the second mask matrix, and the target value can be obtained by performing a product accumulation operation on aligned elements in the first reduced matrix and the second reduced matrix. Therefore, during the convolution operation, there is no need to add some zero elements to perform element alignment, and an absolutely valid operation is performed only by using elements in the first reduced matrix and the second reduced matrix. In this way, when the convolution operation is performed on the first compressed matrix and the second compressed matrix that respectively replace the first to-be-processed matrix and the second to-be-processed matrix, valid elements in the first compressed matrix and the second compressed matrix can be aligned, and an invalid operation caused by a zero element can be avoided in an alignment process, to further improve efficiency of an existing matrix processing method.

In conclusion, in the matrix processing method provided in the first aspect of this application, the non-zero element in the to-be-processed matrix and the distribution matrix used to indicate the position of the non-zero element are determined, and the quantity of non-zero elements, the sequentially arranged non-zero elements, and the distribution matrix are combined into the compressed matrix, so that when a matrix-level operation such as a convolution operation, a multiply-add operation, a multiply-subtract operation, a divide-add operation, or a divide-subtract operation is performed on the sparse matrix, the operation is performed on the compressed matrix that replaces the sparse matrix to obtain an operation result of the sparse matrix, so as to improve operation efficiency for the sparse matrix and further improve efficiency of the matrix processing method.

A second aspect of this application provides a logic circuit. The logic circuit is configured to obtain a first mask matrix and a second mask matrix by using a first distribution matrix and a second distribution matrix. The first distribution matrix is used to indicate a position of a non-zero element in a first to-be-processed matrix. The second distribution matrix is used to indicate a position of a non-zero element in a second to-be-processed matrix. The first mask matrix is used to indicate a first target element in the second distribution matrix, and positions of all first target elements in the second distribution matrix are the same as positions of all elements whose values are 1 in the first distribution matrix. The second mask matrix is used to indicate a second target element in the second distribution matrix, and positions of all second target elements in the first distribution matrix are the same as positions of all elements whose values are 1 in the first distribution matrix.

The logic circuit includes first switch logic and second switch logic.

A first input end of the first switch logic is configured to sequentially receive elements in all positions in the second distribution matrix, a second input end of the first switch logic is configured to sequentially receive elements in the first distribution matrix that are in same positions as the received elements in the second distribution matrix, and an output end of the first switch logic is configured to output the first target element, to form the first mask matrix.

When a value of an element received by the second input end of the first switch logic is 1, the first switch logic outputs, from the output end, an element received by the first input end.

A first input end of the second switch logic is configured to sequentially receive elements in all positions in the first distribution matrix, a second input end of the second switch logic is configured to sequentially receive elements in the second distribution matrix that are in same positions as the received elements in the first distribution matrix, and an output end of the second switch logic is configured to output the second target element, to form the second mask matrix.

When a value of an element received by the second input end of the second switch logic is 1, the second switch logic outputs, from the output end, an element received by the first input end.

According to the logic circuit provided in this embodiment, a method for obtaining the first mask matrix and the second mask matrix by using the first distribution matrix and the second distribution matrix in the foregoing embodiment can be implemented by using relatively simple switch logic. In addition, in one clock of a processor, the switch logic may receive an element in a distribution matrix and output an element in a mask matrix, to ensure smooth running of a subsequent array processor.

In an embodiment of the second aspect of this application, the logic circuit further includes AND gate logic.

A first input end of the AND gate logic is configured to sequentially receive the elements in all the positions in the first distribution matrix, a second input end of the AND gate logic is configured to sequentially receive the elements in the second distribution matrix that are in the same positions as the received elements in the first distribution matrix, and an output end of the AND gate logic is configured to output AND operation results of the first input end of the AND gate logic and the second input end of the AND gate logic to the second input end of the first switch logic and the second input end of the second switch logic.

The AND gate logic that plays a caching function is added to the logic circuit provided in this embodiment to provide a switch turn-on time for the first switch logic and the second switch logic. After switches of the first switch logic and the second switch logic are turned on, the AND gate logic outputs AND operation results to the first switch logic and the second switch logic by using the output end. This ensures that the second input end of the first switch logic and the second input end of the second switch logic accurately receive correct elements.

In an embodiment of the second aspect of this application, the logic circuit further includes a first latch and a second latch.

An input end of the first latch is configured to sequentially receive the elements in all the positions in the second distribution matrix, and an output end of the first latch is configured to output an element received by the input end to the first switch logic after a first preset delay.

An input end of the second latch is configured to sequentially receive the elements in all the positions in the first distribution matrix, and an output end of the second latch is configured to output an element received by the input end to the second switch logic after a second preset delay.

In an embodiment of the second aspect of this application, the first preset delay is a switch turn-on delay of the first switch logic, and the second preset delay is a switch turn-on delay of the second switch logic.

The first latch and the second latch that play a caching function are added to the logic circuit provided in this embodiment. After receiving an element in the second distribution matrix, the first latch provides a switch turn-on time for the first switch logic; and after a switch of the first switch logic is turned on, the first latch outputs the received element to the first switch logic by using the output end. After receiving an element in the first distribution matrix, the second latch provides a switch turn-on time for the second switch logic; and after a switch of the second switch logic is turned on, the second latch outputs the received element to the second switch logic by using the output end. In addition, the first preset delay may be set as the switch turn-on delay of the first switch logic, and the second preset delay may be set as the switch turn-on delay of the second switch logic. This ensures that the second input end of the first switch logic and the second input end of the second switch logic accurately receive correct elements.

In conclusion, the logic circuit provided in the second aspect of this application includes the first switch logic and the second switch logic, so that the first mask matrix and the second mask matrix are obtained by using the first distribution matrix and the second distribution matrix. The first input end of the first switch logic is configured to sequentially receive the elements in all the positions in the second distribution matrix, the second input end of the first switch logic is configured to sequentially receive the elements in the first distribution matrix that are in the same positions as the received elements in the second distribution matrix, and the output end of the first switch logic is configured to output the first target element, to form the first mask matrix. When the value of the element received by the second input end of the first switch logic is 1, the first switch logic outputs, from the output end, the element received by the first input end. The first input end of the second switch logic is configured to sequentially receive the elements in all the positions in the first distribution matrix, the second input end of the second switch logic is configured to sequentially receive the elements in the second distribution matrix that are in the same positions as the received elements in the first distribution matrix, and the output end of the second switch logic is configured to output the second target element, to form the second mask matrix. When the value of the element received by the second input end of the second switch logic is 1, the second switch logic outputs, from the output end, the element received by the first input end. The logic circuit provided in this application has simple logic and low hardware costs. When the logic circuit is applied to a processor for implementation, the first mask matrix and the second mask matrix can be obtained by using the first distribution matrix and the second distribution matrix within one clock time, to improve processing efficiency of the logic circuit.

A third aspect of this application provides a matrix processing apparatus, including:

a first determining module, configured to determine a quantity of non-zero elements in a to-be-processed matrix, where the to-be-processed matrix is a one-dimensional matrix;

a second determining module, configured to generate a distribution matrix of the to-be-processed matrix, where the distribution matrix is used to indicate a position of a non-zero element in the to-be-processed matrix; and a processing module, configured to combine the quantity of non-zero elements, values of all non-zero elements in the to-be-processed matrix arranged sequentially, and the distribution matrix, to obtain a compressed matrix of the to-be-processed matrix.

In an embodiment of the third aspect of this application, the distribution matrix is a one-dimensional matrix, and all elements in the to-be-processed matrix have a one-to-one correspondence with elements in the distribution matrix that are in same positions as the elements in the to-be-processed matrix.

The second determining module is specifically configured to:

sequentially scan the to-be-processed matrix for the elements; and when a scanned element is non-zero, set a value of an element, corresponding to the scanned element, in the distribution matrix to 1; or when a value of the scanned element is 0, set a value of the element, corresponding to the scanned element, in the distribution matrix to 0.

In an embodiment of the third aspect of this application, there are N elements in the to-be-processed matrix and M non-zero elements in the to-be-processed matrix, and correspondingly, there are N elements in the distribution matrix, M elements whose values are 1 in the distribution matrix, and (M+N+1) elements in the compressed matrix, where N is a positive integer, M is a non-negative integer, and M is less than or equal to N.

In an embodiment of the third aspect of this application, the to-be-processed matrix includes a first to-be-processed matrix and a second to-be-processed matrix. A quantity of elements in the first to-be-processed matrix is the same as a quantity of elements in the second to-be-processed matrix. Correspondingly, the distribution matrix includes a first distribution matrix and a second distribution matrix.

The apparatus further includes a calculation module, configured to obtain a target value based on the first distribution matrix, the second distribution matrix, non-zero elements in the first to-be-processed matrix, and non-zero elements in the second to-be-processed matrix. The target value is the same as a result of summing products of each element in the first to-be-processed matrix with an element in the second to-be-processed matrix that is in a same position as the element in the first to-be-processed matrix.

In an embodiment of the third aspect of this application, the calculation module is specifically configured to:

sequentially obtain all first target elements in the second distribution matrix, to form a first mask matrix, where positions of all the first target elements in the second distribution matrix are the same as positions of all elements whose values are 1 in the first distribution matrix;

when a value of an obtained first target element is 1, use a first valid element in the non-zero element in the first to-be-processed matrix as an element in a first reduced matrix, where an arrangement order of the first valid element in the non-zero element in the first to-be-processed matrix is the same as an arrangement order of the obtained first target element in the first mask matrix;

sequentially obtain all second target elements in the first distribution matrix, to form a second mask matrix, where positions of all the second target elements in the first distribution matrix are the same as positions of all elements whose values are 1 in the second distribution matrix;

when a value of an obtained second target element is 1, use a second valid element in the non-zero element in the second to-be-processed matrix as an element in a second reduced matrix, where an arrangement order of the second valid element in the non-zero element in the second to-be-processed matrix is the same as an arrangement order of the obtained second target element in the second mask matrix; and accumulate products of elements in all positions in the first reduced matrix and elements in the second reduced matrix that are in same positions as the elements in the first reduced matrix, to obtain the target value.

In conclusion, according to the matrix processing apparatus provided in the third aspect of this application, the first determining module determines the non-zero element in the to-be-processed matrix, the second determining module determines the distribution matrix used to indicate the position of the non-zero element, and the processing module combines the quantity of non-zero elements, the sequentially arranged non-zero elements, and the distribution matrix into the compressed matrix, so that when a matrix-level operation such as a convolution operation, a multiply-add operation, a multiply-subtract operation, a divide-add operation, or a divide-subtract operation is performed on the sparse matrix, the operation is performed on the compressed matrix that replaces the sparse matrix to obtain an operation result of the sparse matrix, so as to improve operation efficiency of the sparse matrix and further improve efficiency of the matrix processing method.

A fourth aspect of the embodiments of this application provides a matrix processing method, including: obtaining a first to-be-processed matrix and a second to-be-processed matrix, where the first to-be-processed matrix and the second to-be-processed matrix are one-dimensional or multidimensional matrices; determining a first distribution matrix corresponding to the first to-be-processed matrix and a second distribution matrix corresponding to the second to-be-processed matrix, wherein the first distribution matrix is used to indicate a location of at least one non-zero element in the first to-be-processed matrix, and the second distribution matrix is used to indicate a location of at least one non-zero element in the second to-be-processed matrix; determining valid elements of the first to-be-processed matrix and the second to-be-processed matrix according to the first distribution matrix and the second distribution matrix; and; performing data processing on the valid elements of the first to-be-processed matrix and the second to-be-processed matrix, to obtain a same result of performing the data processing on the first to-be-processed matrix and the second to-be-processed matrix.

In an embodiment of the fourth aspect, when at least one of the first to-be-processed matrix and the second to-be-processed matrix is a multidimensional matrix, the method further includes: converting at least one of the first to-be-processed matrix and the second to-be-processed matrix into a one-dimensional matrix according to a preset first arrangement order.

In an embodiment of the fourth aspect, the determining a first distribution matrix corresponding to the first to-be-processed matrix and a second distribution matrix corresponding to the second to-be-processed matrix includes: sequentially acquiring each element in the first to-be-processed matrix according to a preset second arrangement order; and; when an element in the acquired first to-be-processed matrix is a non-zero element, recording a first value; when an element in the acquired first to-be-processed matrix is a zero element, recording a second value; sequentially acquiring the recorded value, so as to determine the first distribution matrix; and; successively acquiring, according to the second arrangement order, each element in the second to-be-processed matrix; and; when an element in the obtained second to-be-processed matrix is a non-zero element, recording the first value; and; when an element in the acquired second to-be-processed matrix is a zero element, recording the second value; and; sequentially acquiring the recorded value, so as to determine the second distribution matrix.

In an embodiment of the fourth aspect, the first permutation order is the same as the second permutation order, and in another embodiment, the first permutation order is different from the second permutation order.

In an embodiment of the fourth aspect, the first value is 1 and the second value is 0.

In an embodiment of the fourth aspect, the determining valid elements of the first to-be-processed matrix and the second to-be-processed matrix according to the first distribution matrix and the second distribution matrix includes: performing a bitwise AND operation on the first distribution matrix and the second distribution matrix to obtain a mask matrix; and; determining the valid elements of the first to-be-processed matrix and the second to-be-processed matrix according to element distribution of the mask matrix.

In an embodiment of the fourth aspect, the determining valid elements of the first to-be-processed matrix and the second to-be-processed matrix according to element distribution of the mask matrix includes: obtaining elements in the first to-be-processed matrix and the second to-be-processed matrix that correspond to element locations whose values are 1 in the mask matrix as the valid elements.

In an embodiment of the fourth aspect, the first simplified matrix includes valid elements of the first to-be-processed matrix, the second simplified matrix includes valid elements of the second to-be-processed matrix, and a convolution result of the first to-be-processed matrix and the second to-be-processed matrix is the same as a convolution result of the first simplified matrix and the second simplified matrix.

A fifth aspect of the embodiments of this application provides a logic circuit, including an AND gate logic, first switch logic, and second switch logic, where; the first input end of the AND gate logic is configured to sequentially receive elements at each location in the first distribution matrix corresponding to the first to-be-processed matrix, and the second input end of the AND gate logic is configured to sequentially receive elements at locations that are the same as the locations of the elements in the received first distribution matrix and that are in the second distribution matrix corresponding to the second to-be-processed matrix; and, the output end of the AND gate logic is configured to output an AND operation result of the first input end of the AND gate logic and the second input end of the AND gate logic to the second input end of the first switch logic and the second input end of the second switch logic; a first input end of the first switch logic is configured to sequentially receive elements at each position in the first to-be-processed matrix or the first distribution matrix, and an output end of the first switch logic is configured to output a switch logical operation result of the first input end of the first switch logic and a switch logical operation result of the second input end of the first switch logic; a first input end of the second switch logic is configured to receive elements at each position in the second to-be-processed matrix or the second distribution matrix in sequence, and an output end of the first switch logic is configured to output a switch logic operation result of the first input end of the second switch logic and the second input end of the second switch logic.

In an embodiment of the fifth aspect, the switching logic includes: when a second input end of the first switching logic receives 1, outputting a received element synchronously from the first input end of the first switching logic; and; when the second input end of the second switch logic receives 1, synchronously output the received element at the first input end of the second switch logic.

In an embodiment of the fifth aspect, a result output of the first switch logic and a result output of the second switch logic are convoluted.

According to a sixth aspect, an embodiment of this application provides a matrix processing apparatus, including a processor and a memory. The memory is configured to store a program; and the processor is configured to invoke the program stored in the memory, to perform the matrix processing method according to any one of the embodiments of the first or fourth aspect of this application.

According to a seventh aspect, an embodiment of this application provides a computer readable storage medium. The computer readable storage medium stores program code, and the program code is executed to perform the matrix processing method according to any one of the embodiments of the first or fourth aspect of this application.

DESCRIPTION OF EMBODIMENTS

The following describes the embodiments of this application with reference to the accompanying drawings in the embodiments of this application.

Figure 1:
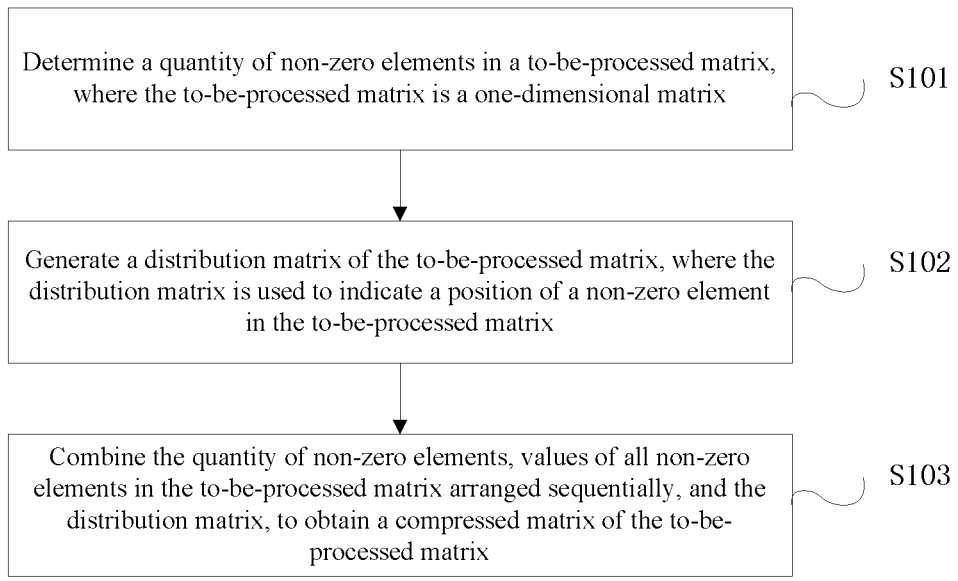
FIG. 1 is a schematic flowchart of an embodiment of a matrix processing method according to this application.

FIG. 1 is a schematic flowchart of an embodiment of a matrix processing method according to this application. As shown in FIG. 1, the matrix processing method provided in this embodiment includes the following steps:

S101: Determine a quantity of non-zero elements in a to-be-processed matrix, where the to-be-processed matrix is a one-dimensional matrix.

S102: Generate a distribution matrix of the to-be-processed matrix, where the distribution matrix is used to indicate a position of a non-zero element in the to-be-processed matrix.

S103: Combine the quantity of non-zero elements, values of all non-zero elements in the to-be-processed matrix arranged sequentially, and the distribution matrix, to obtain a compressed matrix of the to-be-processed matrix.

Specifically, this embodiment may be performed by a processor having a data processing function in an electronic device, for example, a central processing unit (CPU) or a graphics processing unit (GPU). The electronic device may be a mobile phone, a tablet computer, a desktop computer, a notebook computer, or the like.

In this embodiment, when the processor needs to compress the to-be-processed matrix to obtain the compressed matrix of the to-be-processed matrix, the processor processes the to-be-processed matrix by using the matrix processing method. After determining a non-zero element in the to-be-processed matrix and the distribution matrix used to indicate the position of the non-zero element, the processor combines the quantity of non-zero elements, the sequentially arranged non-zero elements, and the distribution matrix into the compressed matrix.

Optionally, the to-be-processed matrix in this embodiment is a sparse matrix. The processor compresses a sparse matrix that needs to be processed, to obtain the compressed matrix, so as to improve storage efficiency of the processor for the sparse matrix. In addition, when a matrix-level operation such as a convolution operation, a multiply-add operation, a multiply-subtract operation, a divide-add operation, or a divide-subtract operation is performed on the sparse matrix, the operation is performed on the compressed matrix that replaces the sparse matrix to obtain an operation result of the sparse matrix, so as to improve operation efficiency of the processor for the sparse matrix.

Optionally, the to-be-processed matrix in this embodiment is a one-dimensional matrix, or the to-be-processed matrix may be a multi-dimensional matrix. It should be noted that in the embodiments of this application, descriptions are usually provided by using an example in which the to-be-processed matrix is the one-dimensional matrix, and a processing manner and principle of the one-dimensional matrix in this application may also be applied to a multi-dimensional matrix processing method.

Optionally, when the to-be-processed matrix in this embodiment is a multi-dimensional matrix, a dimension reduction operation may be first performed on the to-be-processed matrix. For example, elements in a two-dimensional matrix may be read row by row to obtain a one-dimensional matrix, and then the matrix processing method in this embodiment of this application is applied to the obtained one-dimensional matrix.

Optionally, in this embodiment, all elements in the to-be-processed matrix have a one-to-one correspondence with elements in the distribution matrix that are in same positions as the elements in the to-be-processed matrix, and the elements in the distribution matrix can be used to determine whether the corresponding elements in the to-be-processed matrix are non-zero elements. For example, the distribution matrix includes a first-type element and a second-type element. A position of the first-type element in the distribution matrix is the same as a position of a non-zero element in the to-be-processed matrix, and a position of the second-type element in the distribution matrix is the same as a position of a zero element in the to-be-processed matrix. The first-type element and the second-type element are two types of elements that are indicated in different manners and that have definitely different characteristics. For example, the first-type element is a constant 1, and the second-type element is a constant 0. Alternatively, the first-type element is an odd number, and the second-type element is an even number.

Figure 2:
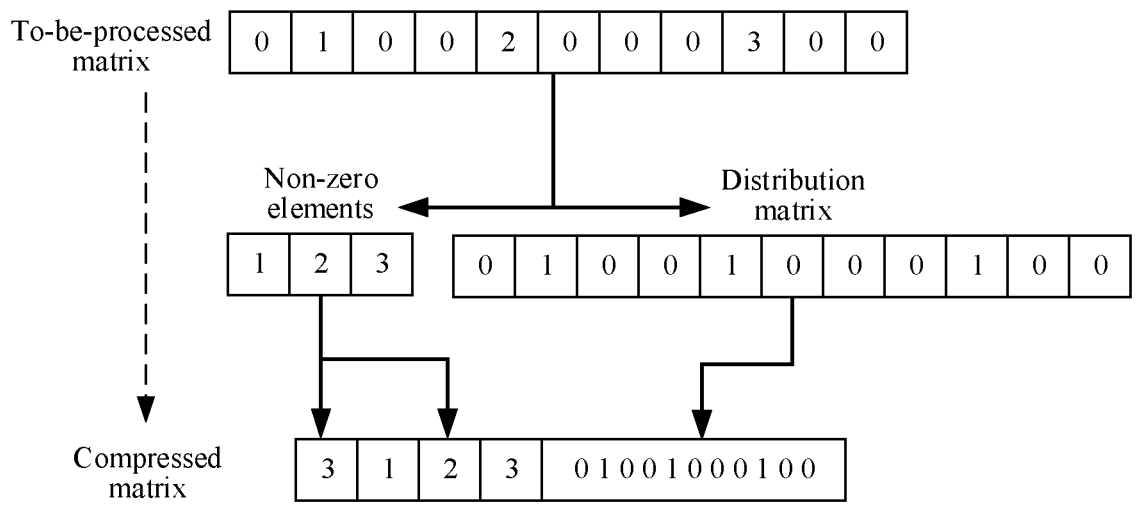
FIG. 2 is a schematic flowchart of determining a compressed matrix in a matrix processing method according to this application.

The following uses a procedure shown in FIG. 2 as an example to describe the matrix processing method shown in FIG. 1. FIG. 2 is a schematic flowchart of determining a compressed matrix in a matrix processing method according to this application. A to-be-processed matrix in FIG. 2 is [0, 1, 0, 0, 2, 0, 0, 0, 3, 0, 0]. In this case, when processing the to-be-processed matrix to obtain a compressed matrix, the processor determines that non-zero elements in the to-be-processed matrix are sequentially arranged as [1, 2, 3], and generates that a distribution matrix of the to-be-processed matrix is [0, 1, 0, 0, 1, 0, 0, 0, 1, 0, 0]. Then, the processor combines a quantity [3] of the determined non-zero elements, the sequentially arranged non-zero elements [1, 2, 3], and the distribution matrix [0, 1, 0, 0, 1, 0, 0, 0, 1, 0, 0] to finally obtain the compressed matrix [3, 1, 2, 3, 0, 1, 0, 0, 1, 0, 0, 0, 1, 0, 0].

Figures 3, 4:
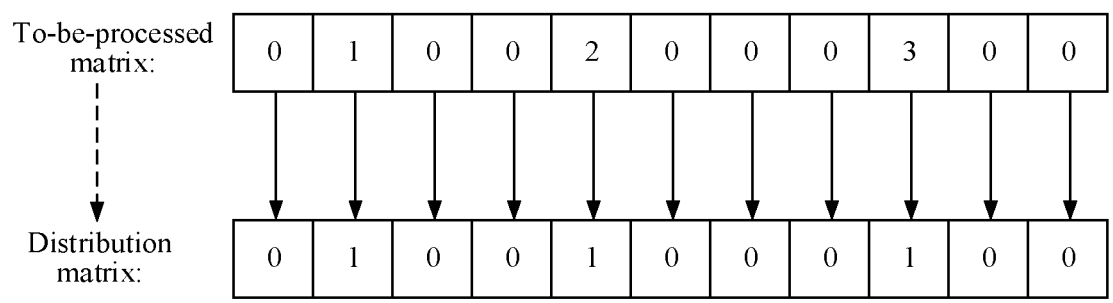
FIG. 3 is a schematic flowchart of determining a distribution matrix in a matrix processing method according to this application.
FIG. 4 is a schematic structural diagram of a compressed matrix in a matrix processing method according to this application.

Optionally, in the foregoing example, the step of generating a distribution matrix of the to-be-processed matrix in step S102 is as follows: The processor sequentially scans the to-be-processed matrix for elements; when a scanned element is non-zero, sets a value of an element, corresponding to the scanned element, in the distribution matrix to 1; or when a value of a scanned element is 0, sets a value of the element, corresponding to the scanned element, in the distribution matrix to 0. For example, FIG. 3 is a schematic flowchart of determining a distribution matrix in a matrix processing method according to this application. A to-be-processed matrix in FIG. 3 has a same quantity of dimensions as the distribution matrix, and all elements in the to-be-processed matrix are in a one-to-one correspondence with those in the distribution matrix. Values of elements in the distribution matrix that correspond to non-zero elements in the to-be-processed matrix and that are in same positions as the non-zero elements are 1, and values of elements in the distribution matrix that correspond to zero elements in the to-be-processed matrix and that are in same positions as the zero elements are 0.

Optionally, in the foregoing embodiment, when there are N elements in the to-be-processed matrix and M non-zero elements in the to-be-processed matrix, correspondingly, there are N elements in the distribution matrix, M elements whose values are 1 in the distribution matrix, and (M+N+1) elements in the compressed matrix. Herein, N is a positive integer, M is a non-negative integer, and M is less than or equal to N. In addition, the compressed matrix obtained through combination in step S103 may be arranged as follows: the quantity of non-zero elements, the sequentially arranged non-zero elements, and the distribution matrix. For example, in the example in FIG. 2, the obtained compressed matrix is [3, 1, 2, 3, 0, 1, 0, 0, 1, 0, 0, 0, 1, 0, 0]. It should be noted that the foregoing arrangement manner is merely an example. An arrangement order of the quantity of non-zero elements, the sequentially arranged non-zero elements, and the distribution matrix is not specifically limited in this embodiment. For example, FIG. 4 is a schematic structural diagram of a compressed matrix in a matrix processing method according to this application. Different arrangement manners of the compressed matrix shown in FIG. 4 all fall within the protection scope of embodiments. However, in the embodiments of this application, descriptions are provided by using an example in which all compressed matrices are arranged as follows: a quantity of non-zero elements, sequentially arranged non-zero elements, and a distribution matrix.

Optionally, in the foregoing embodiment, when elements in the distribution matrix are expressed by using a constant 0 and a constant 1, each element in the distribution matrix includes 1 bit. In this case, when a quantity of bits of each element in the to-be-processed matrix is greater than 1, for example, when the quantity of bits of the element in the to-be-processed matrix may be 8, 16, or 32, although a quantity of dimensions of the distribution matrix is the same as a quantity of dimensions of the to-be-processed matrix, storage space required by the distribution matrix is less than storage space of the to-be-processed matrix. Therefore, after the to-be-processed matrix is compressed into a compressed matrix, storage space of the to-be-processed matrix is saved, and storage efficiency of the processor is improved.

Figure 5:
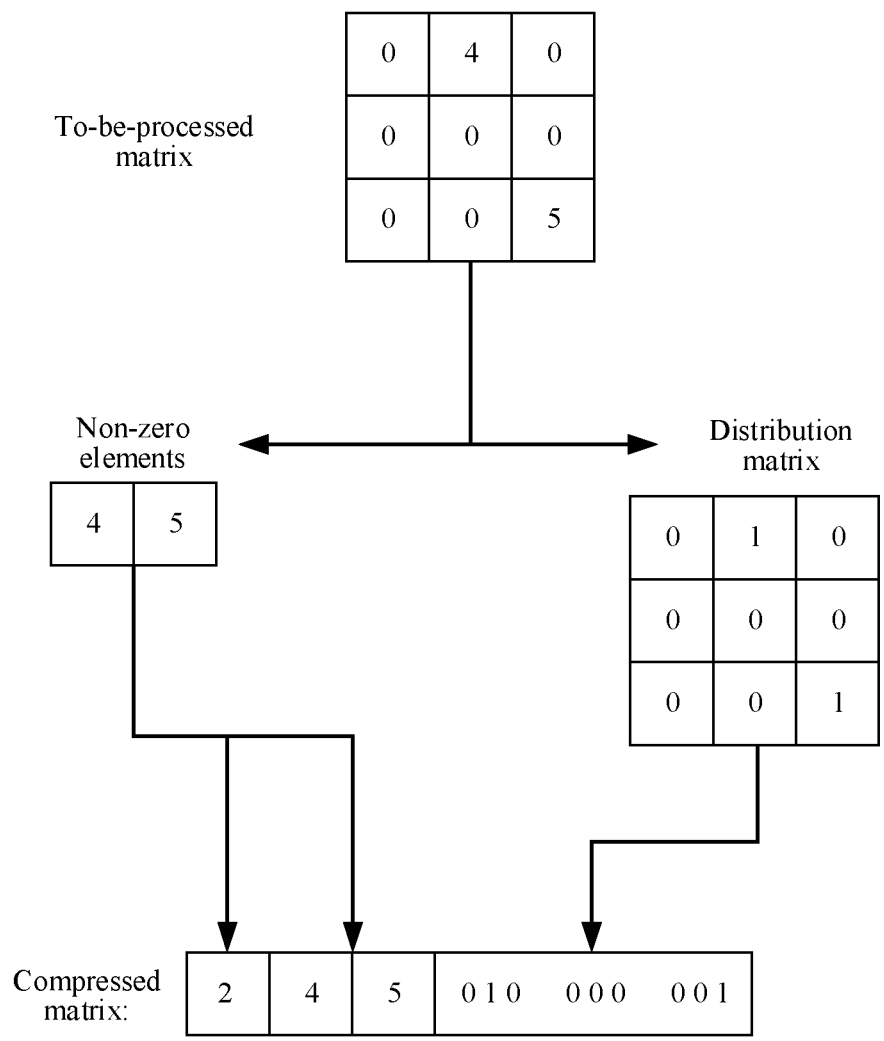
FIG. 5 is a schematic flowchart of determining a compressed matrix in a matrix processing method according to this application.

Further, in addition to being used to process a one-dimensional matrix, the matrix processing method shown in FIG. 1 can be further used to process a multi-dimensional matrix. FIG. 5 is a schematic flowchart of determining a compressed matrix in a matrix processing method according to this application. An example in which the to-be-processed matrix is a multi-dimensional matrix is used in FIG. 5 to describe a case in which the matrix processing method shown in FIG. 1 is applied to the multi-dimensional matrix. The to-be-processed matrix shown in FIG. 5 is [0, 4, 0; 0, 0, 0; 0, 0, 5] and includes three rows and three columns in terms of a quantity of dimensions. In this case, before processing the to-be-processed matrix to obtain the compressed matrix, the processor may change the multi-dimensional to-be-processed matrix into a one-dimensional matrix through scanning, and then process the one-dimensional matrix. For example, the to-be-processed matrix [0, 4, 0; 0, 0, 0; 0, 0, 5] is changed into a one-dimensional matrix [0, 4, 0, 0, 0, 0, 0, 0, 5] through scanning. To indicate a quantity of dimensions of the to-be-processed matrix, information, for example, [0, 4, 0, 0, 0, 0, 0, 0, 5, 3, 3], about the quantity of dimensions of the to-be-processed matrix may be added to the one-dimensional matrix obtained through scanning, to use the last two elements [3, 3] in the one-dimensional matrix to indicate that the to-be-processed matrix is a multi-dimensional matrix with three rows and three columns. Subsequently, the processor determines, based on the one-dimensional matrix obtained through scanning, that non-zero elements in the to-be-processed matrix are sequentially arranged as [4, 5], and determines that a distribution matrix is [0, 1, 0, 0, 0, 0, 0, 0, 1, 3, 3]. The last two elements in the distribution matrix are also used to indicate the quantity of dimensions of the to-be-processed matrix. Alternatively, when the processor has learned the quantity of dimensions of the to-be-processed matrix during calculation or can determine the quantity of dimensions of the to-be-processed matrix by using another parameter, the quantity of dimensions of the to-be-processed matrix may be not indicated in the distribution matrix. A quantity [2] of the determined non-zero elements, the sequentially arranged non-zero elements [4, 5], and the distribution matrix [0, 1, 0, 0, 0, 0, 0, 0, 1] are combined to finally obtain a compressed matrix [2, 4, 5, 0, 1, 0, 0, 0, 0, 0, 0, 1] of the to-be-processed matrix. In this embodiment, a manner of processing the multi-dimensional matrix to obtain the compressed matrix of the multi-dimensional matrix is merely an example. For the compressed matrix, a new row or column may be further added to the distribution matrix of the to-be-processed matrix, and an element in the newly added row or column is used to indicate a non-zero element in the to-be-processed matrix and distribution and a quantity of non-zero elements, to be specific, a multi-dimensional compressed matrix can be obtained after a multi-dimensional to-be-processed matrix is processed. For example, the compressed matrix may be represented as [2, 4, 5, 0, 1, 0, 0, 0, 0, 0, 0, 1]. When there are fewer elements in the newly added row or column, a plurality of rows or columns may be added, or when there are more elements in the newly added row or column, a zero element may be supplemented to perform alignment on the obtained multi-dimensional compressed matrix.

In another feasible implementation, dimension reduction may be performed on the to-be-processed matrix [0, 4, 0; 0, 0, 0; 0, 0, 5] to obtain a one-dimensional matrix [0, 4, 0, 0, 0, 0, 0, 0, 5], and then matrix processing shown in FIG. 1 is performed on the one-dimensional matrix obtained after the dimension reduction.

In conclusion, in the matrix processing method provided in this application, the quantity of non-zero elements in the to-be-processed matrix is determined to determine the distribution matrix used to indicate the position of the non-zero element in the to-be-processed matrix, and the quantity of non-zero elements, the values of all the non-zero elements in the to-be-processed matrix arranged sequentially, and the distribution matrix are combined, to obtain the compressed matrix of the to-be-processed matrix, so that when a matrix-level operation such as convolution operation, a multiply-add operation, a multiply-subtract operation, a divide-add operation, or a divide-subtract operation is performed on the sparse matrix, the operation is performed on the compressed matrix that replaces the sparse matrix to obtain an operation result of the sparse matrix, so as to improve storage efficiency and operation efficiency of the processor for the sparse matrix, and further improve processing efficiency of the matrix processing method.

Further, in the foregoing embodiment, the to-be-processed matrix includes a first to-be-processed matrix and a second to-be-processed matrix. A quantity of elements in the first to-be-processed matrix is the same as a quantity of elements in the second to-be-processed matrix. Correspondingly, the distribution matrix includes a first distribution matrix and a second distribution matrix. In this case, the matrix processing method shown in FIG. 1 further includes: obtaining a target value based on the first distribution matrix, the second distribution matrix, non-zero elements in the first to-be-processed matrix, and non-zero elements in the second to-be-processed matrix. The target value is the same as a result of accumulating products of elements in all positions in the first to-be-processed matrix and elements in the second to-be-processed matrix that are in same positions as the elements in the first to-be-processed matrix.

The target value may be an operation result obtained when a convolution operation or the like is performed on the first to-be-processed matrix and the second to-be-processed matrix. If the convolution operation is directly performed on the first to-be-processed matrix and the second to-be-processed matrix, products of elements in all positions in the first to-be-processed matrix and elements in the second to-be-processed matrix that are in same positions as the elements in the first to-be-processed matrix need to be accumulated. However, in this embodiment, a convolution operation is performed on a first distribution matrix and a non-zero element in a first compressed matrix and a second distribution matrix and a non-zero element in a second compressed matrix that respectively replace the first to-be-processed matrix and the second to-be-processed matrix, and an obtained target value is the same as the result of performing the convolution operation on the first to-be-processed matrix and the second to-be-processed matrix.

Figure 6:
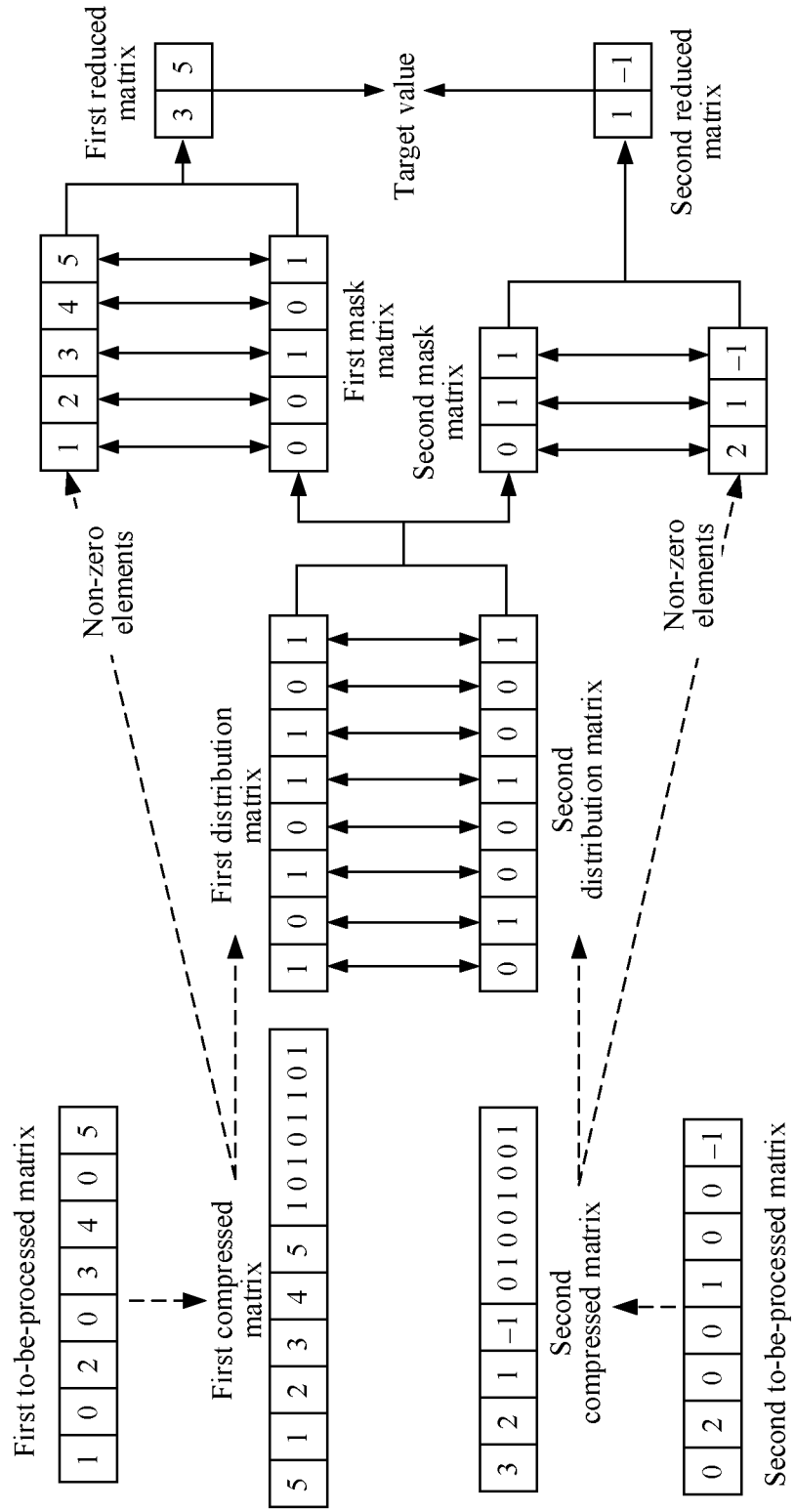
FIG. 6 is a schematic flowchart of an embodiment of a matrix processing method according to this application.

Specifically, the foregoing method is described by using a procedure of determining a compressed matrix in FIG. 6 as an example. FIG. 6 is a schematic flowchart of an embodiment of a matrix processing method according to this application. As shown in FIG. 6, a first to-be-processed matrix is [1, 0, 2, 0, 3, 4, 0, 5], and a second to-be-processed matrix is [0, 2, 0, 0, 1, 0, 0, −1]. A first compressed matrix [5, 1, 2, 3, 4, 5, 1, 0, 1, 0, 1, 1, 0, 1] is obtained after the first to-be-processed matrix is processed in FIG. 1. A first distribution matrix is [1, 0, 1, 0, 1, 1, 0, 1], and non-zero elements are [1, 2, 3, 4, 5]. A second compressed matrix [3, 2, 1, −1, 0, 1, 0, 0, 1, 0, 0, 1] is obtained after the second to-be-processed matrix is processed in FIG. 1. A second distribution matrix is [0, 1, 0, 0, 1, 0, 0, 1], and non-zero elements are [2, 1, −1]. In this case, the obtaining a target value based on the first distribution matrix, the second distribution matrix, non-zero elements in the first to-be-processed matrix, and non-zero elements in the second to-be-processed matrix specifically includes:

sequentially obtaining a total of five first target elements, namely, 0, 0, 1, 0, and 1, from the second distribution matrix [0, 1, 0, 0, 1, 0, 0, 1], to form a first mask matrix [0, 0, 1, 0, 1], where positions of all first target elements in the second distribution matrix are the same as positions of all elements whose values are 1 in the first distribution matrix; and comparing the obtained first mask matrix with the non-zero elements in the first to-be-processed matrix that are in the first compressed matrix, and when a value of a first target element in the obtained first mask matrix is 1, using a first valid element in the non-zero element in the first to-be-processed matrix as an element in a first reduced matrix, that is, comparing [0, 0, 1, 0, 1] with [1, 2, 3, 4, 5] to obtain two first valid elements 3 and 5, so as to obtain the first reduced matrix [3, 5], where an arrangement order of the first valid element in the non-zero element in the first to-be-processed matrix is the same as an arrangement order of the obtained first target element in the first mask matrix; and sequentially obtaining three second target elements 0, 1, and 1 from the first distribution matrix [1, 0, 1, 0, 1, 1, 0, 1], to form a second mask matrix [0, 1, 1], where positions of all second target elements in the first distribution matrix are the same as positions of all elements whose values are 1 in the second distribution matrix; and comparing the obtained second mask matrix with the non-zero elements in the second to-be-processed matrix that are in the second compressed matrix, and when a value of a second target element in the obtained second mask matrix is 1, using a second valid element in the non-zero element in the second to-be-processed matrix as an element in a second reduced matrix, that is, comparing [0, 1, 1] with [2, 1, −1] to obtain two second valid elements 1 and −1, so as to obtain the second reduced matrix [1, −1], where an arrangement order of the second valid element in the non-zero element in the second to-be-processed matrix is the same as an arrangement order of the obtained second target element in the second mask matrix.

Subsequently, a convolution operation is performed on the first reduced matrix and the second reduced matrix that respectively replace the first to-be-processed matrix and the second to-be-processed matrix. Specifically, products of elements in all positions in the first reduced matrix and elements in the second reduced matrix that are in same positions as the elements in the first reduced matrix are accumulated, that is, 3×1+5×(−1), to obtain a target value −2 as a result of performing the convolution operation on the first to-be-processed matrix and the second to-be-processed matrix. The target value is the same as a result of accumulating products of elements in all positions in the first to-be-processed matrix and elements in the second to-be-processed matrix that are in same positions as the elements in the first to-be-processed matrix, that is, the operation result obtained by performing the convolution operation on the first to-be-processed matrix and the second to-be-processed matrix is the same as the target value.

In conclusion, in the matrix processing method provided in this embodiment, the convolution operation can be performed on the first compressed matrix and the second compressed matrix that respectively replace the first to-be-processed matrix and the second to-be-processed matrix, to obtain the target value as the result of performing the convolution operation on the first to-be-processed matrix and the second to-be-processed matrix. In addition, in a process of calculating the first compressed matrix and the second compressed matrix, the first mask matrix and the second mask matrix can be determined by using the first distribution matrix and the second distribution matrix, the first reduced matrix and the second reduced matrix are finally determined based on the first mask matrix and the second mask matrix, and the target value can be obtained by performing a product accumulation operation on aligned elements in the first reduced matrix and the second reduced matrix. Therefore, during the convolution operation, there is no need to add some zero elements to perform element alignment, and an absolutely valid operation is performed only by using elements in the first reduced matrix and the second reduced matrix. In this way, when the convolution operation is performed on the first compressed matrix and the second compressed matrix that respectively replace the first to-be-processed matrix and the second to-be-processed matrix, valid elements in the first compressed matrix and the second compressed matrix can be aligned, and an invalid operation caused by a zero element can be avoided in an alignment process, to further improve efficiency of an existing matrix processing method.

In another feasible implementation manner, after the first distribution matrix and the second distribution matrix that are respectively corresponding to the first to-be-processed matrix and the second to-be-processed matrix are obtained according to the method in the foregoing embodiment, valid elements of the first to-be-processed matrix and the second to-be-processed matrix may be determined according to the first distribution matrix and the second distribution matrix. Performing data processing on valid elements of the first to-be-processed matrix and the second to-be-processed matrix, to obtain a same result of performing the data processing on the first to-be-processed matrix and the second to-be-processed matrix.

It may be understood that, by determining the valid elements of the first to-be-processed matrix and the second to-be-processed matrix, data processing is performed only on the valid elements. Compared with data processing performed on the entire to-be-processed matrix, data processing is simpler and more efficient.

More specifically, for the first distribution matrix [1,0,1, 0,1,1,0,1] and the second distribution matrix [0,1,0,0,1,0,0, 1] in FIG. 6.

First, an AND operation is performed, bit by bit, on each element in the first distribution matrix and each element in the second distribution matrix corresponding to the position of the element, to obtain a mask matrix [0, 0, 0, 0, 1, 0, 1].

Then, a location of an element whose value is 1 in the mask matrix is corresponding to an element in the first to-be-processed matrix and the second to-be-processed matrix, and is used as a valid element of the first to-be-processed matrix and the second to-be-processed matrix. That is, when the elements at the fifth and the eighth locations in the mask matrix are 1, the first to-be-processed matrix [1,0,2,0,3,4,0,5] is determined, and the elements at the fifth and the eighth locations, namely, 3,5, are valid elements of the first to-be-processed matrix, determining that the valid element of the second to-be-processed matrix is 1, −1.

Then, similar to the foregoing embodiment, a data processing result of the first to-be-processed matrix and a data processing result of the second to-be-processed matrix are obtained according to the valid elements [3, 5] and [1,−1].

In this embodiment, a convolution operation result of [1,0,2,0,3,4,0,5] and [0,2,0,0,1,0,0,−1] may be obtained by using a convolution operation of [3,5] and [1,−1].

Figure 7:
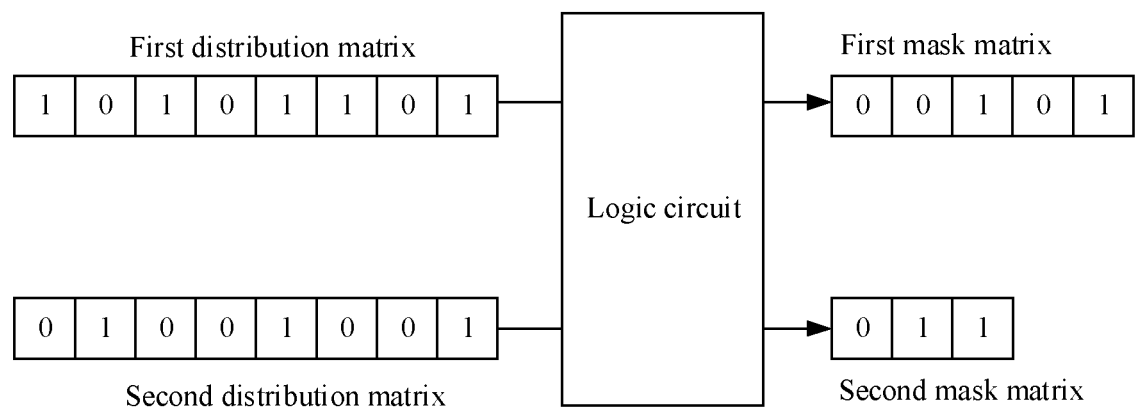
FIG. 7 is a schematic flowchart of determining a mask matrix by using a distribution matrix in a matrix processing method according to this application.

FIG. 7 is a schematic flowchart of determining a mask matrix by using a distribution matrix in a matrix processing method according to this application. As shown in FIG. 7, this application further provides a logic circuit, configured to obtain a first mask matrix and a second mask matrix by using a first distribution matrix and a second distribution matrix in the foregoing embodiments. Elements in all positions in the first distribution matrix and elements in the second distribution matrix that are in same positions as the elements in the first distribution matrix are input into the logic circuit. The logic circuit sequentially outputs first target elements and sequentially outputs second target elements, so as to respectively form the first mask matrix and the second mask matrix.

Figure 8:
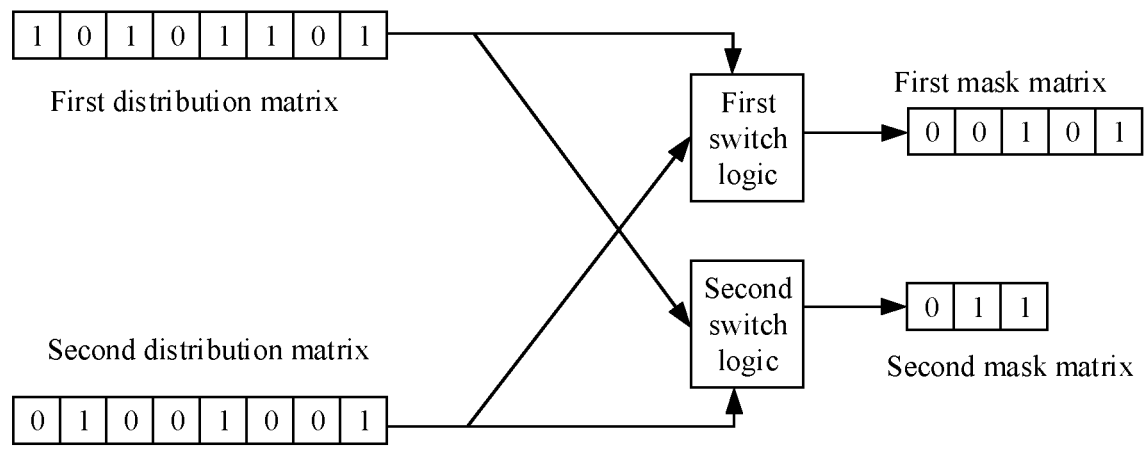
FIG. 8 is a schematic structural diagram of an embodiment of a logic circuit according to this application.

Specifically, FIG. 8 is a schematic structural diagram of an embodiment of a logic circuit according to this application. The logic circuit shown in FIG. 8 includes first switch logic and second switch logic.

A first input end of the first switch logic is configured to sequentially receive elements in all positions in a second distribution matrix, a second input end of the first switch logic is configured to sequentially receive elements in a first distribution matrix that are in same positions as the received elements in the second distribution matrix, and an output end of the first switch logic is configured to output a first target element, to form a first mask matrix. When a value of an element received by the second input end of the first switch logic is 1, a switch of the first switch logic is turned on to output, from the output end, an element received by the first input end; or when a value of an element received by the second input end of the first switch logic is 0, a switch of the first switch logic is turned off, and an element received by the first input end is not output from the output end.

For example, the first input end of the first switch logic shown in FIG. 8 receives the first element [0] in the second distribution matrix, and the second input end receives the first element [1] in the first distribution matrix. Because the second input end receives the element [1], the first input end and the output end that are of the first switch logic are connected, and the element [0] received by the first input end is used as a first target element and is output from the output end to the first mask matrix. Then, the first input end of the first switch logic receives the second element [1] in the second distribution matrix, and the second input end receives the second element [0] in the first distribution matrix. Because the second input end receives the element [0], the first input end and the output end that are of the first switch logic are disconnected. Then, the first input end of the first switch logic receives the third element [0] in the second distribution matrix, and the second input end receives the third element [1] in the first distribution matrix. Because the second input end receives the element [1], the first input end and the output end that are of the first switch logic are connected, and the element [0] received by the first input end is used as a first target element and is output from the output end to the first mask matrix. By analogy, after the first input end of the first switch logic receives the last element [1] in the second distribution matrix, the second input end receives the last element [1] in the first distribution matrix, and the output end outputs the element [1] to the first mask matrix, all first target elements that are output by using the output end of the first switch logic are sequentially arranged to form the first mask matrix [0, 0, 1, 0, 1].

In addition, a first input end of the second switch logic is configured to sequentially receive elements in all positions in the first distribution matrix, a second input end of the second switch logic is configured to sequentially receive elements in the second distribution matrix that are in same positions as the received elements in the first distribution matrix, and an output end of the second switch logic is configured to output a second target element, to form a second mask matrix. When a value of an element received by the second input end of the second switch logic is 1, a switch of the second switch logic is turned on to output, from the output end, an element received by the first input end; or when a value of an element received by the second input end of the second switch logic is 0, a switch of the second switch logic is turned off, and an element received by the first input end is not output from the output end.

For example, the first input end of the second switch logic shown in FIG. 8 receives the first element [1] in the first distribution matrix, and the second input end of the second switch logic receives the first element [0] in the second distribution matrix. Because the second input end receives the element [0], the first input end and the output end that are of the second switch logic are disconnected. Then, the first input end of the second switch logic receives the first element [0] in the first distribution matrix, and the second input end of the second switch logic receives the first element [1] in the second distribution matrix. Because the second input end receives the element [1], the first input end and the output end that are of the second switch logic are connected, and the element [0] received by the first input end is used as a second target element and is output from the output end to the second mask matrix. By analogy, after the first input end of the second switch logic receives the last element [1] in the first distribution matrix, the second input end receives the last element [1] in the second distribution matrix, and the output end outputs the element [1] to the second mask matrix, all second target elements that are output by using the output end of the second switch logic are sequentially arranged to form the second mask matrix [0, 1, 1].

Optionally, a plurality of logic circuits provided in this embodiment may be further disposed in parallel in the processor, and each logic circuit may receive elements in the first distribution matrix and the second distribution matrix. Each logic circuit receives elements in both the first distribution matrix and the second distribution matrix, and separately outputs a first target element and a second target element based on the received elements. Finally, first target elements output by all the logic circuits may be sequentially arranged to form the first mask matrix, and second target elements output by all the logic circuits may be sequentially arranged to form the second mask matrix. In this embodiment, in a same clock of the processor, the first switch logic may sequentially receive elements in the first distribution matrix and the second distribution matrix, and the second switch logic may sequentially receive elements in both the first distribution matrix and the second distribution matrix.

In conclusion, according to the logic circuit provided in this embodiment, a method for obtaining the first mask matrix and the second mask matrix by using the first distribution matrix and the second distribution matrix in the foregoing embodiment can be implemented by using relatively simple switch logic. In addition, in one clock of the processor, the switch logic may receive an element in a distribution matrix and output an element in a mask matrix, to simplify the logic circuit and further improve matrix processing efficiency.

Figure 9:
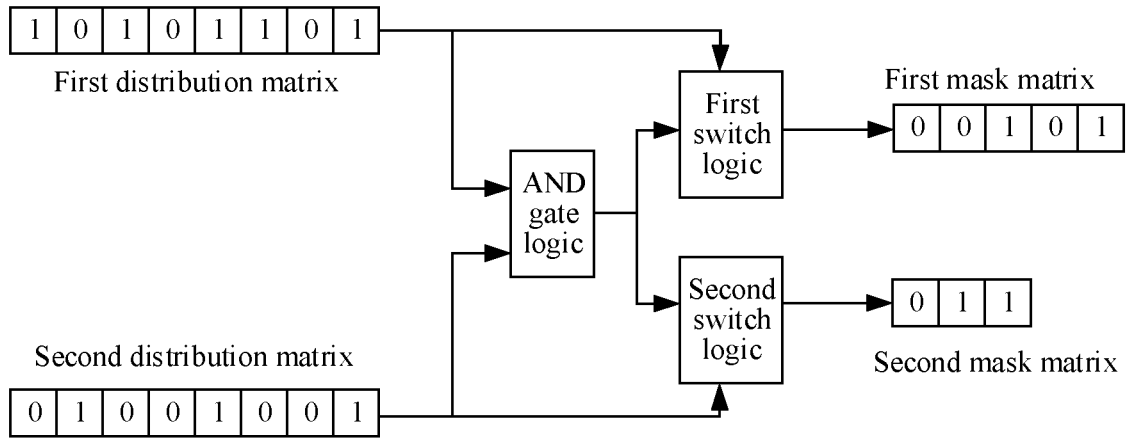
FIG. 9 is a schematic structural diagram of an embodiment of a logic circuit according to this application.

FIG. 9 is a schematic structural diagram of an embodiment of a logic circuit according to this application. The logic circuit provided in this embodiment may be configured to replace the logic circuit shown in FIG. 8. Specifically, based on the logic circuit shown in FIG. 8, the logic circuit shown in FIG. 9 further includes AND gate logic. A first input end of the AND gate logic is configured to sequentially receive the elements in all the positions in the first distribution matrix, a second input end of the AND gate logic is configured to sequentially receive the elements in the second distribution matrix that are in the same positions as the received elements in the first distribution matrix, and an output end of the AND gate logic is configured to output AND operation results of the first input end of the AND gate logic and the second input end of the AND gate logic to the second input end of the first switch logic and the second input end of the second switch logic.

Specifically, when the logic circuit shown in FIG. 8 obtains the first mask matrix and the second mask matrix by using the first distribution matrix and the second distribution matrix, switches of the first switch logic and the second switch logic need to be turned on when the second input end of the first switch logic and the second input end of the second switch logic receive elements [1]. If in a switch turn-on delay, refreshing of an input element is caused because an element received by the first input end is lost or cannot be synchronized, elements output by the output end may be disordered after a switch is turned on. Therefore, in this embodiment, the AND gate logic is disposed. The first input end and the second input end of the AND gate logic respectively sequentially receive the elements in all the positions in the first distribution matrix and the elements in the second distribution matrix that are in the same positions as the received elements in the first distribution matrix. After an AND operation is performed on the elements in the first distribution matrix and the elements in the second distribution matrix, results are output from the output end to the second input end of the first switch logic and the second input end of the second switch logic. The AND gate logic herein plays a caching function to provide a switch turn-on time for the first switch logic and the second switch logic. After switches are turned on, the AND gate logic outputs the AND operation results to the first switch logic and the second switch logic by using the output end. This ensures that the second input end of the first switch logic and the second input end of the second switch logic accurately receive correct elements. Principles of the first input ends, the second input ends, and the output ends of the first switch logic and the second switch logic in the embodiment shown in FIG. 9 are the same as those in the embodiment in FIG. 8. Details are not described again.

In another feasible implementation manner, the logic circuit shown in FIG. 9 includes an AND gate logic, first switch logic, and second switch logic. the first input end of the AND gate logic is configured to sequentially receive elements at each location in the first distribution matrix corresponding to the first to-be-processed matrix, and the second input end of the AND gate logic is configured to sequentially receive elements at locations that are the same as the locations of the elements in the received first distribution matrix and that are in the second distribution matrix corresponding to the second to-be-processed matrix; and, the output end of the AND gate logic is configured to output an AND operation result of the first input end of the AND gate logic and the second input end of the AND gate logic to the second input end of the first switch logic and the second input end of the second switch logic; a first input end of the first switch logic is configured to sequentially receive elements at each position in the first to-be-processed matrix or the first distribution matrix, and an output end of the first switch logic is configured to output a switch logical operation result of the first input end of the first switch logic and a switch logical operation result of the second input end of the first switch logic; a first input end of the second switch logic is configured to receive elements at each position in the second to-be-processed matrix or the second distribution matrix in sequence, and an output end of the first switch logic is configured to output a switch logic operation result of the first input end of the second switch logic and the second input end of the second switch logic.

In a feasible implementation, the switching logic includes: when the second input end of the first switching logic receives 1, outputting the received element synchronously from the first input end of the first switching logic; and; when the second input end of the second switch logic receives 1, synchronously output the received element at the first input end of the second switch logic.

In a feasible implementation, the result output of the first switch logic and the result output of the second switch logic are output, and a convolution operation is performed to obtain the convolution results of the first to-be-processed matrix and the second to-be-processed matrix.

Figure 10:
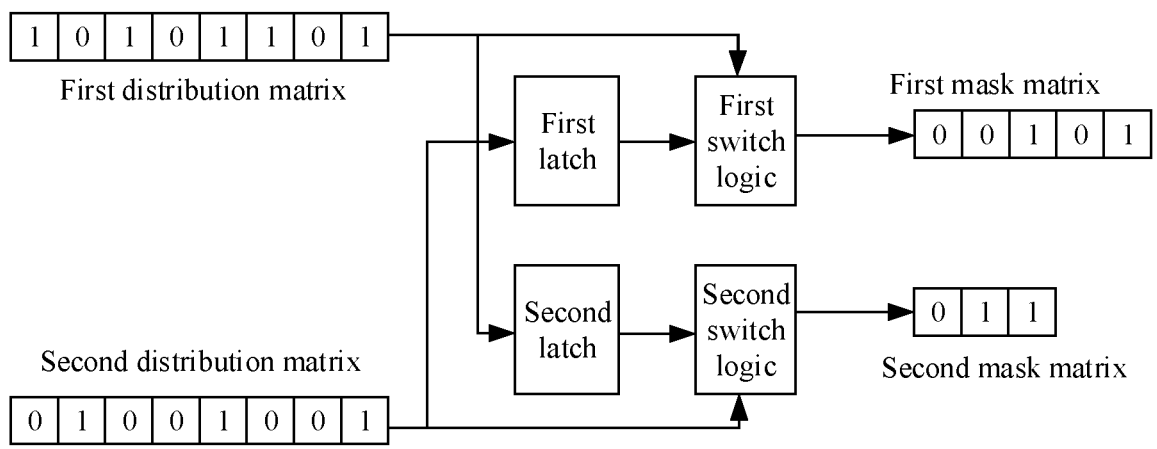
FIG. 10 is a schematic structural diagram of an embodiment of a logic circuit according to this application.

FIG. 10 is a schematic structural diagram of an embodiment of a logic circuit according to this application. The logic circuit provided in this embodiment may be configured to replace the logic circuit shown in FIG. 8. Specifically, based on the logic circuit shown in FIG. 8, the logic circuit shown in FIG. 10 further includes a first latch and a second latch. An input end of the first latch is configured to sequentially receive the elements in all the positions in the second distribution matrix, and an output end of the first latch is configured to output an element received by the input end to the first switch logic after a first preset delay. An input end of the second latch is configured to sequentially receive the elements in all the positions in the first distribution matrix, and an output end of the second latch is configured to output an element received by the input end to the second switch logic after a second preset delay.

Specifically, the embodiment shown in FIG. 10 provides another method for ensuring that the second input end of the first switch logic and the second input end of the second switch logic accurately receive correct elements. Both the first latch and the second latch play a caching function. After receiving an element in the second distribution matrix, the first latch provides a switch turn-on time for the first switch logic; and after a switch of the first switch logic is turned on, the first latch outputs a received element to the first switch logic by using the output end. After receiving an element in the first distribution matrix, the second latch provides a switch turn-on time for the second switch logic; and after a switch of the second switch logic is turned on, the second latch outputs a received element to the second switch logic by using the output end. Therefore, optionally, the first preset delay may be set as a switch turn-on delay of the first switch logic, and the second preset delay may be set as a switch turn-on delay of the second switch logic. The turn-on delay of the first switch logic is the same as the turn-on delay of the second switch logic. Principles of the first input ends, the second input ends, and the output ends of the first switch logic and the second switch logic in the embodiment shown in FIG. 10 are the same as those in the embodiment in FIG. 8. Details are not described again.

Further, the matrix processing method in the foregoing embodiments may be applied to a processor with a systolic array architecture to perform a convolution operation on a matrix without changing an existing systolic array architecture.

Figure 11:
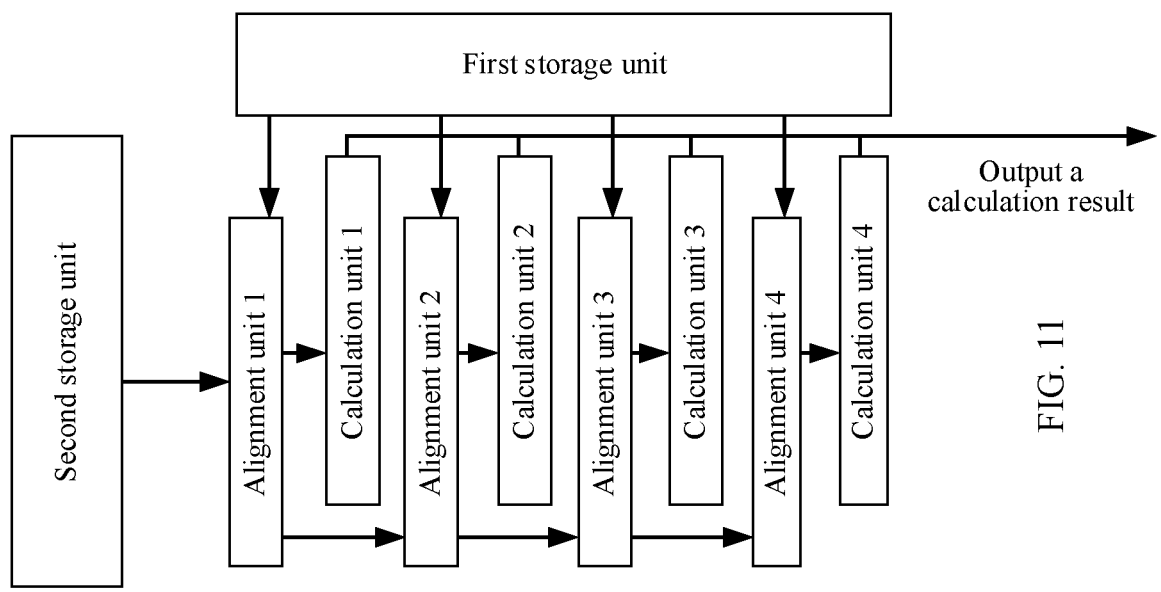
FIG. 11 is a schematic diagram of a processing structure of a systolic array processor to which a matrix processing method is applied according to this application.

For example, FIG. 11 is a schematic diagram of a processing structure of a systolic array processor to which a matrix processing method is applied according to this application. As shown in FIG. 11, when an existing systolic array processor performs a convolution or full-link operation, assuming that a first storage unit and a second storage unit each store four matrices, the processor respectively preloads four to-be-calculated matrices in the first storage unit into calculation units 1 to 4. Then, the matrices in the second storage unit are sequentially loaded into the calculation unit 1, and after calculation is performed on the matrices and a preloaded matrix, the matrices are transmitted to the calculation unit 2. The calculation unit 2 sequentially receives matrices on which calculation is completed in the calculation unit 1, and after calculation is performed on the matrices and a preloaded matrix, transmits the matrices to the calculation unit 3, and so on.

To implement the matrix processing method in this application, in the embodiment shown in FIG. 11, an alignment unit may be added before each calculation unit in the systolic array processor, to align, before matrix calculation, compressed matrices obtained after processing is performed by using the method shown in FIG. 1, so that the calculation unit implements valid calculation only on the first reduced matrix and the second reduced matrix. This ensures that the calculation unit does not perform invalid calculation related to a zero value. The alignment unit and the calculation unit may be implemented by using a software program in the processor. Alternatively, the alignment unit may be implemented by using a logic circuit in the processor, and a logic circuit used by each alignment unit may be the logic circuit shown in any one of FIG. 7 to FIG. 10.

FIG. 12A to FIG. 12E are schematic diagrams of a processing procedure in which a matrix processing method is applied to a systolic array processor according to this application. The following describes, by using the processing procedure in FIG. 12A to FIG. 12E, the processing structure of the systolic array processor shown in FIG. 11. The processing procedure in FIG. 12A to FIG. 12E may be as follows: The processor performs convolution or full-link calculation on a matrix. For example, when performing convolution or full-link calculation in a deep learning network, the processor needs to perform a convolution operation on a parameter matrix and a data matrix that are in the deep learning network.

Figure 12A:
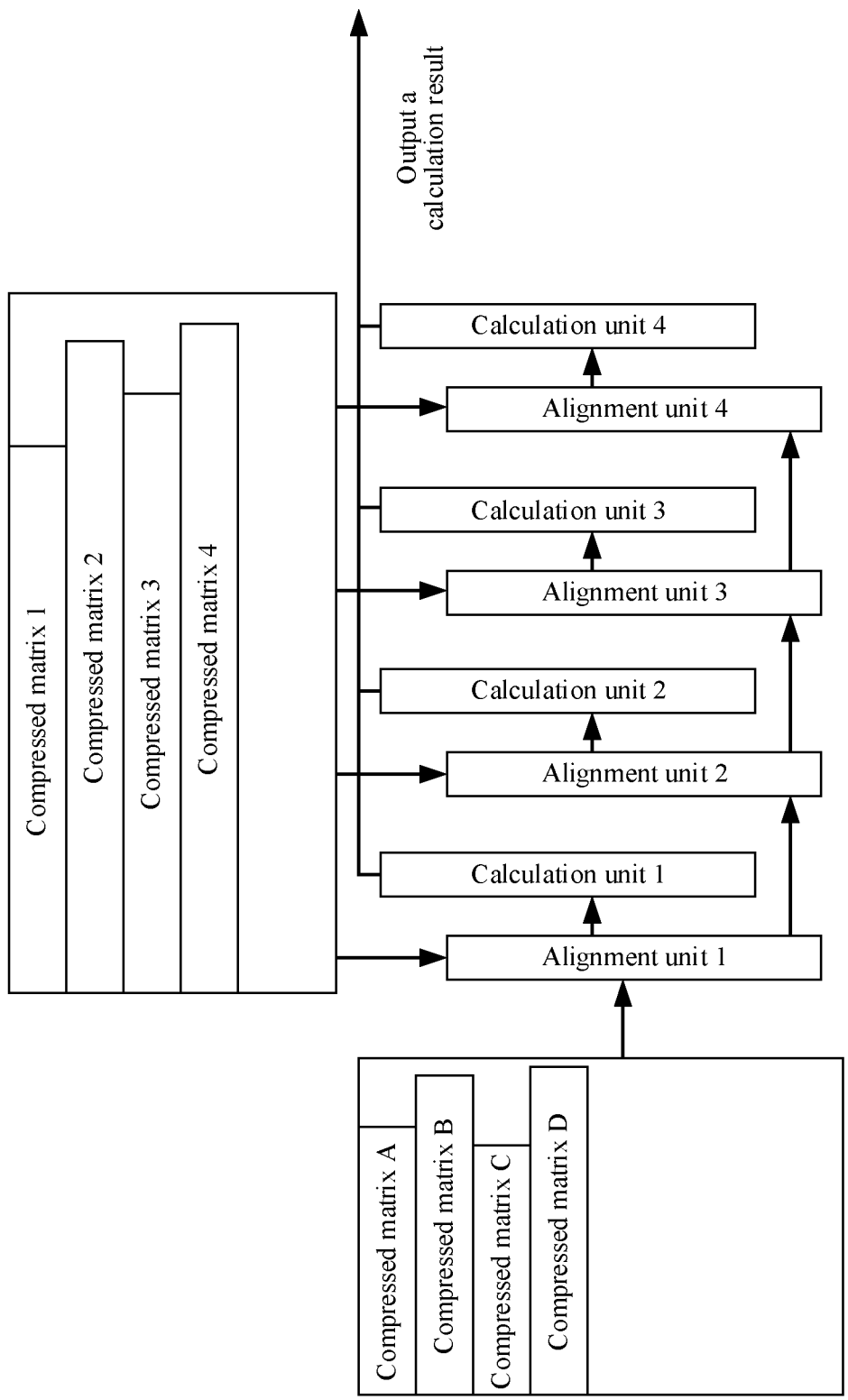
FIG. 12A to FIG. 12E are schematic diagrams of a processing procedure in which a matrix processing method is applied to a systolic array processor according to this application.

As shown in FIG. 12A, the processor first needs to process, by using the method shown in FIG. 1, a parameter matrix that needs to be calculated, to obtain a compressed matrix 1, a compressed matrix 2, a compressed matrix 3, and a compressed matrix 4 that are to be calculated, and stores the foregoing matrices in a first storage unit of the processor. The processor processes, by using the method shown in FIG. 1, a data matrix that needs to be calculated, to obtain a compressed matrix A, a compressed matrix B, a compressed matrix C, and a compressed matrix D that are to be calculated, and stores the foregoing matrices in a second storage unit of the processor. The first storage unit and the second storage unit may be different storage units in the processor, or may be in different storage positions in a same storage unit. This is not limited herein.

Figure 12B:
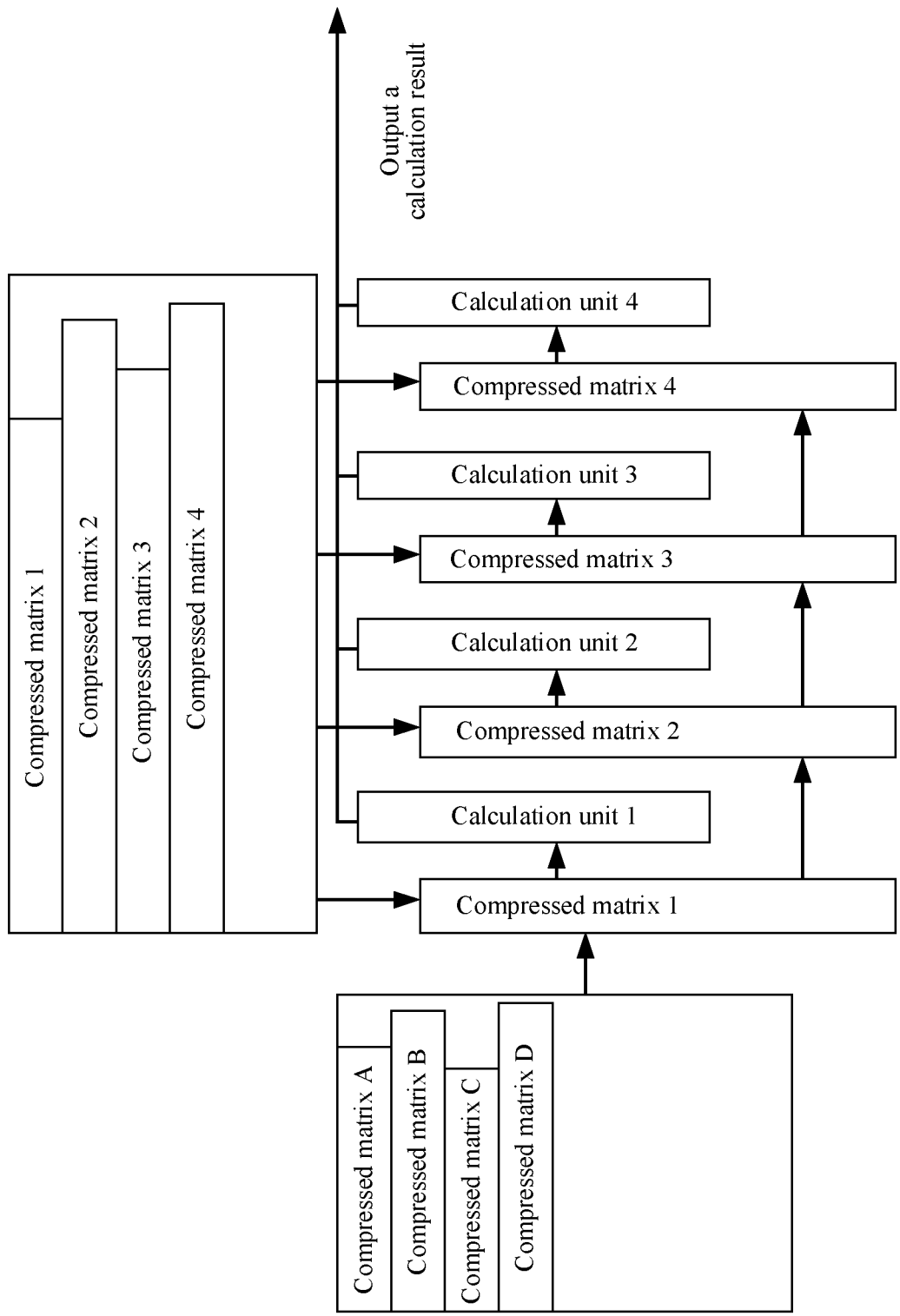

As shown in FIG. 12B, the processor respectively preloads a compressed matrix 1, a compressed matrix 2, a compressed matrix 3, and a compressed matrix 4 that are in a first storage unit into an alignment unit 1, an alignment unit 2, an alignment unit 3, and an alignment unit 4. More specifically, the matrix preloaded into the alignment unit may be non-zero elements sequentially arranged in the compressed matrix and a distribution matrix.

Figure 12C:
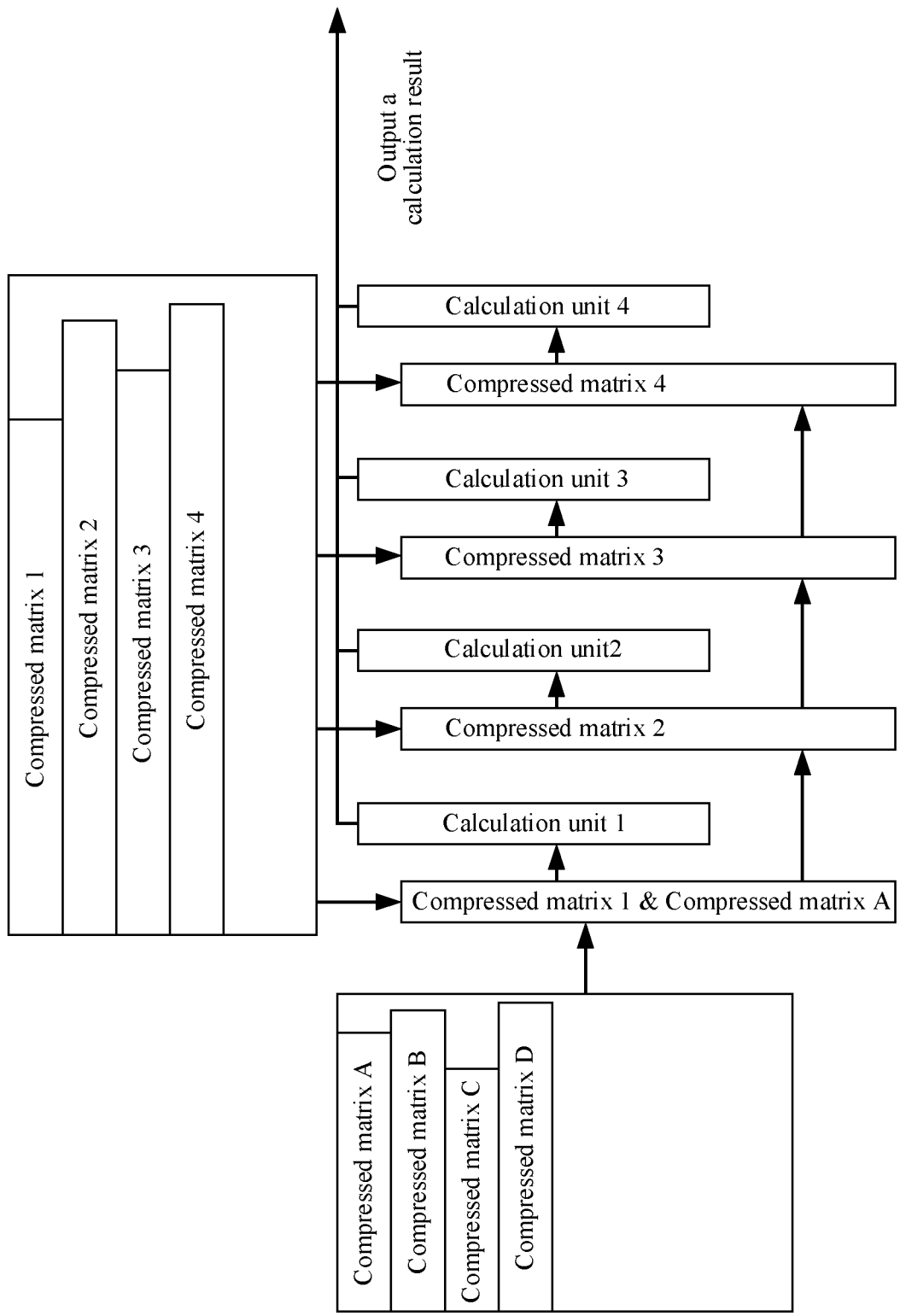

As shown in FIG. 12C, the processor loads a compressed matrix A in a second storage unit into an alignment unit 1, so that the alignment unit 1 determines, by using a distribution matrix in a compressed matrix 1 and a distribution matrix in the compressed matrix A, a reduced matrix 1 corresponding to the compressed matrix 1 and a reduced matrix A corresponding to a compressed matrix B.

Figure 12D:
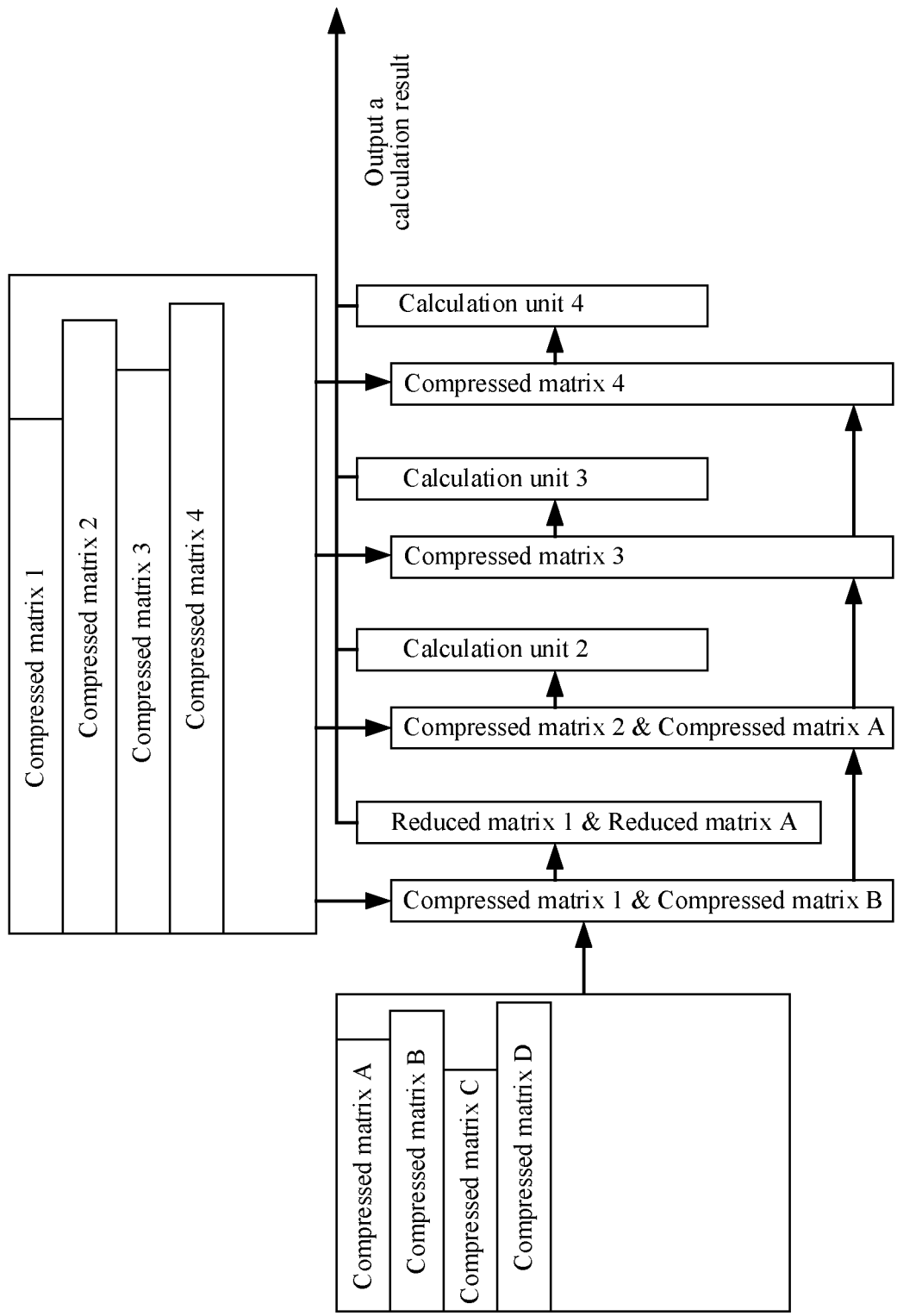

As shown in FIG. 12D, the processor outputs the reduced matrix 1 and the reduced matrix A that are obtained in the step in FIG. 12C to a calculation unit 1, and the calculation unit 1 accumulates products of elements in same positions in the reduced matrix 1 and the reduced matrix A. The processor further loads a compressed matrix B in the second storage unit into an alignment unit 1, so that the alignment unit 1 determines, by using the distribution matrix in the compressed matrix 1 and the distribution matrix in the compressed matrix A, the reduced matrix 1 corresponding to the compressed matrix 1 and a reduced matrix B corresponding to the compressed matrix B. The processor further loads an aligned compressed matrix A in the calculation unit 1 into an alignment unit 2, so that the alignment unit 2 determines, by using a distribution matrix in the compressed matrix 2 and the distribution matrix in the compressed matrix A, a reduced matrix 2 corresponding to the compressed matrix 2 and a reduced matrix A corresponding to the compressed matrix A.

Figure 12E:
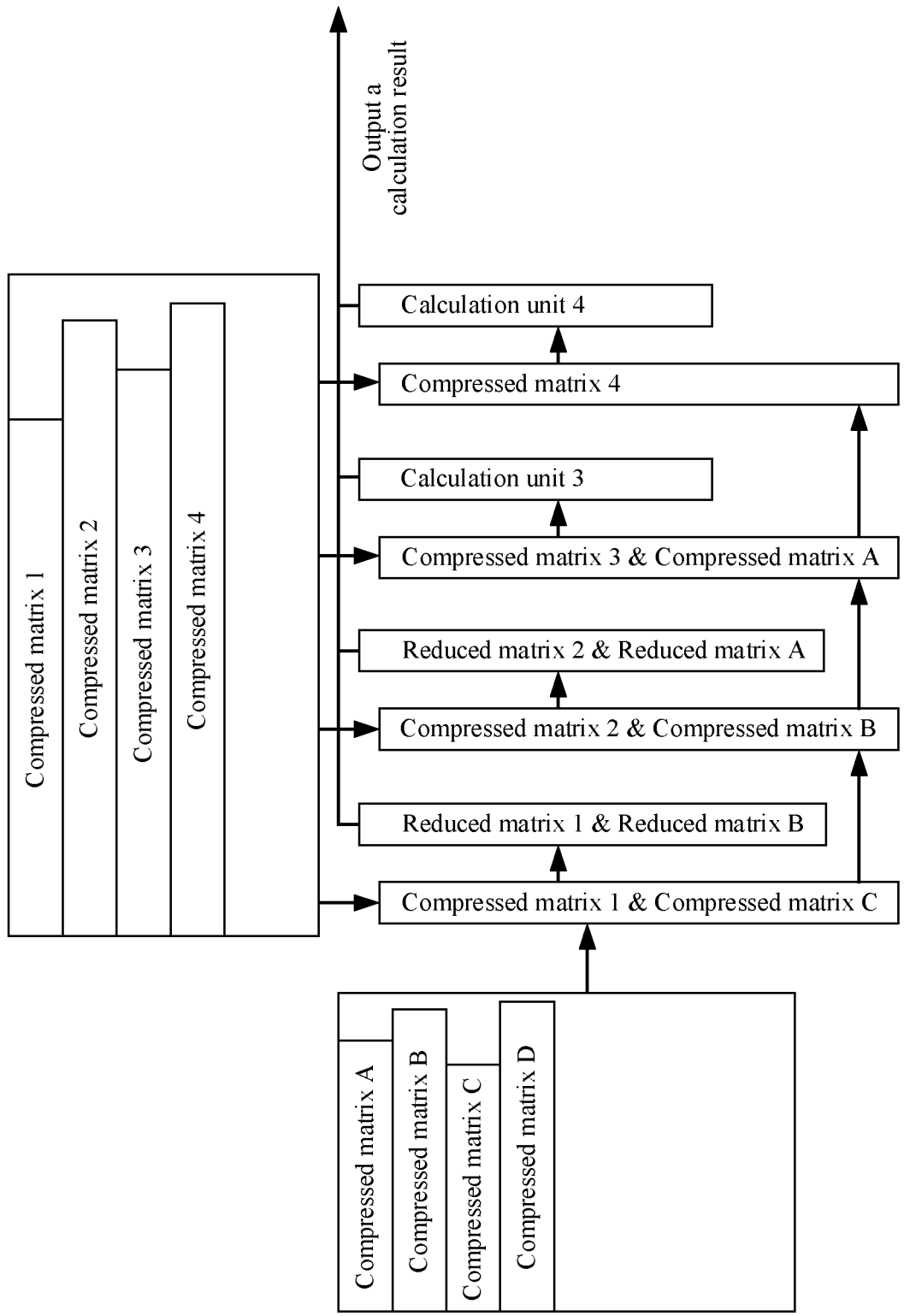

As shown in FIG. 12E, the processor outputs the reduced matrix 1 and the reduced matrix B that are obtained in the step in FIG. 12D to the calculation unit 1, and the calculation unit 1 accumulates products of elements in same positions in the reduced matrix 1 and the reduced matrix B. The processor outputs the reduced matrix 2 and the reduced matrix A that are obtained in the step in FIG. 12D to a calculation unit 2, and the calculation unit 2 accumulates products of elements in same positions in the reduced matrix 2 and the reduced matrix A. The processor further loads a compressed matrix C in the second storage unit into the alignment unit 1, so that the alignment unit 1 determines, by using the distribution matrix in the compressed matrix 1 and a distribution matrix in the compressed matrix C, the reduced matrix 1 corresponding to the compressed matrix 1 and a reduced matrix C corresponding to the compressed matrix C. The processor further loads an aligned compressed matrix B in the calculation unit 1 into the alignment unit 2, so that the alignment unit 2 determines, by using a distribution matrix in the compressed matrix 2 and a distribution matrix in the compressed matrix B, a reduced matrix 2 corresponding to the compressed matrix 2 and a reduced matrix B corresponding to the compressed matrix B. The processor further loads an aligned compressed matrix A in the calculation unit 2 into an alignment unit 3, so that the alignment unit 3 determines, by using a distribution matrix in the compressed matrix 3 and the distribution matrix in the compressed matrix A, a reduced matrix 3 corresponding to the compressed matrix 3 and a reduced matrix A corresponding to the compressed matrix A.

After the processing shown in FIG. 12E is completed, the alignment unit 1 continues to load a next to-be-processed compressed matrix D from the second storage unit, and each alignment unit continues to transmit a compressed matrix to a next alignment unit after an alignment action is performed. Each alignment unit transmits reduced matrices obtained by using two loaded compressed matrices to a corresponding calculation unit for calculation, and the calculation unit outputs a calculation result. For a method and a principle for determining a reduced matrix by using a compressed matrix, refer to the foregoing embodiments of this application. Details are not described again.

In conclusion, when the matrix processing method provided in this application is applied to the systolic array processor, and the processor performs convolution or full-link calculation in a deep learning network, after compressing a parameter matrix and a data matrix that are to be calculated, the processor can calculate a compressed data matrix and parameter matrix by using an alignment unit and a calculation unit that are in the processor. Therefore, during calculation, invalid calculation related to a zero-element performed by the calculation unit is avoided, to improve storage efficiency and operation efficiency of the processor. In addition, the matrix processing method provided in this application can be compatible with an existing processor that uses a systolic array architecture. This facilitates implementation and popularization of the matrix processing method in this application.

Optionally, the matrix processing method provided in this application may be further applied to an image convolution operation performed by a processor. An image that can be processed by the processor is a digital image, and the digital image is represented by an image matrix including grayscale values of pixels in the image. Performing an image convolution operation by the processor is sliding on an image matrix by using a convolution kernel (or referred to as a convolution template), and accumulating products of elements in corresponding positions in the image matrix in a convolution-kernel sliding process and elements in the convolution kernel, to finally obtain elements in an output matrix. This process is referred to as image convolution.

Figure 13:
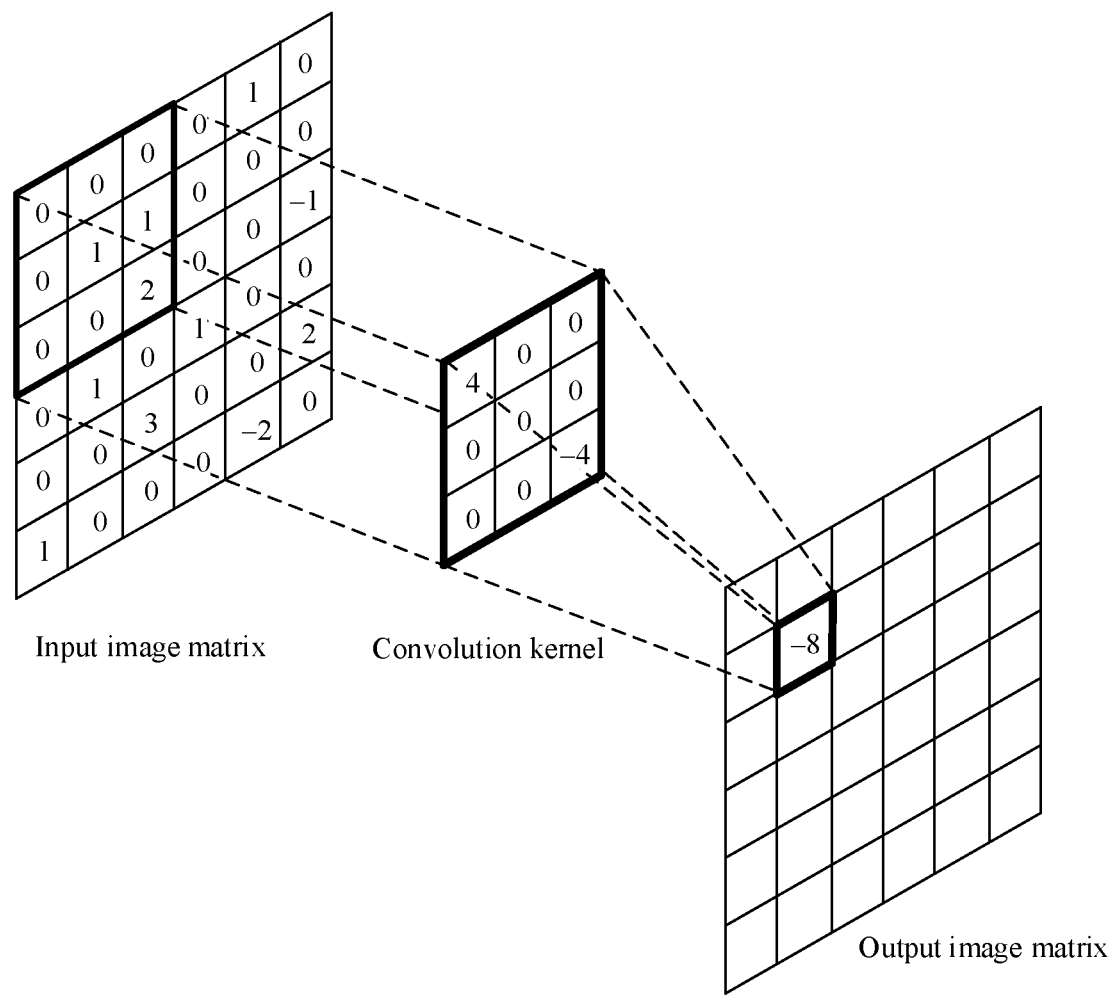
FIG. 13 is a schematic diagram of a processing structure in which a matrix processing method is applied to an image convolution operation according to this application.

Specifically, FIG. 13 is a schematic diagram of a processing structure in which a matrix processing method is applied to an image convolution operation according to this application. A to-be-processed matrix on which a convolution operation is performed is an input image matrix in the figure, and the matrix includes six rows and six columns in terms of a quantity of dimensions. If a convolution kernel with a quantity of dimensions of three rows and three columns is selected for the convolution operation, when performing a convolution operation on the input image matrix, the processor sequentially aligns elements in a convolution kernel with elements in an intermediary matrix with a quantity of dimensions of three rows and three columns that is in the input image matrix; accumulates products of aligned elements in the convolution kernel and the intermediary matrix to obtain a calculation result; and uses the calculation result as an element that is in the input image matrix and that corresponds to a position in a to-be-calculated intermediary matrix in the input image matrix. When convolution calculation is performed on the obtained convolution kernel and intermediary matrix, compression processing may be performed on the intermediary matrix and the convolution kernel by using the matrix processing method in the embodiment shown in FIG. 5 of this application, to obtain a compressed matrix of the convolution kernel and a compressed matrix of the intermediary matrix. Subsequently, an operation is performed on the obtained two compressed matrices by using the matrix processing method shown in the embodiment in FIG. 6 of this application, to obtain a result of performing a convolution operation on the convolution kernel and the intermediary matrix.

For example, the convolution kernel shown in FIG. 13 is [4, 0, 0; 0, 0, 0; 0, 0, −4]. When a convolution operation is performed on an input image matrix, nine elements in the convolution kernel are first aligned with nine elements in the first row to the third row and the first column to the third column in the input image matrix, to obtain a to-be-calculated intermediary matrix [0, 0, 0; 0, 1, 1; 0, 0, 2]. According to the method shown in FIG. 5, a compressed matrix [2, 4, −4, 1, 0, 0, 0, 0, 0, 0, 0, 1] of the convolution kernel is obtained after the convolution kernel is processed, and a compressed matrix [3, 1, 1, 2, 0, 0, 0, 0, 1, 1, 0, 0, 1] of the intermediary matrix is obtained after the intermediary matrix is processed. Subsequently, a mask matrix [0, 1] of the convolution kernel and a mask matrix [0, 0, 1] of the intermediary matrix are determined based on a distribution matrix [1, 0, 0, 0, 0, 0, 0, 0, 1] of the convolution kernel and a distribution matrix [0, 0, 0, 0, 1, 1, 0, 0, 1] of the intermediary matrix. A reduced matrix [−4] of the convolution kernel is determined based on the mask matrix of the convolution kernel; a reduced matrix [2] of the intermediary matrix is determined based on the mask matrix of the intermediary matrix; and a target value −8 is obtained by using the obtained two reduced matrices, and −8 is used as an element in the second row and the second column in an output image matrix. Then, the convolution kernel is translated rightward by one element, and is aligned with nine elements in the first row to the third row and the second column to the fourth column in the input image matrix, to obtain an aligned intermediary matrix [0, 0, 0; 1, 1, 0; 2, 0, 0]; and products of corresponding elements in the convolution kernel and the intermediary matrix continue to be accumulated by using the foregoing matrix processing method, and an obtained result is used as an element in the second row and the third column in the output image matrix. By analogy, all elements in the second row to the fifth row and the second column to the fifth column in the output image matrix are finally obtained. The matrix processing method in the foregoing example may be used to perform all calculation processes of the intermediary matrix and the convolution kernel. In addition, elements in the first row, the sixth row, the first column, and the sixth column that are on outermost sides in the output image matrix are related to an image convolution boundary, and therefore may be processed by ignoring a boundary element, reserving an original boundary element, or the like. Because matrix processing is not performed, this embodiment sets no specific limitation thereto.

In conclusion, the matrix processing method provided in this application can be applied to the image convolution operation performed by the processor. When a multiply-add operation is performed on the convolution kernel used in the convolution operation and an intermediary matrix of a corresponding image matrix, the target value is obtained by performing an operation on the compressed matrix of the convolution kernel and the compressed matrix of the intermediary matrix. When the operation is performed on the compressed matrices, there is no need to add some zero elements to perform element alignment, and an absolutely valid operation is performed only by using elements in the first reduced matrix and the second reduced matrix. Therefore, invalid calculation related to a zero element is avoided during calculation, so that an operation speed of the image convolution operation can be increased, and processing efficiency of the processor for the image convolution operation can be further improved.

Figure 14:
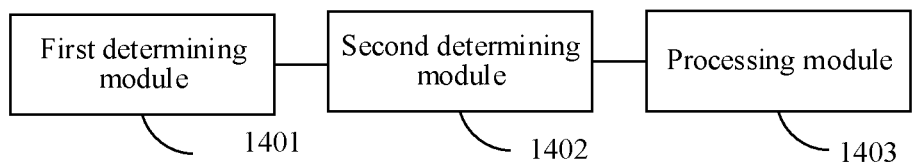
FIG. 14 is a schematic structural diagram of an embodiment of a matrix processing apparatus according to this application.

FIG. 14 is a schematic structural diagram of an embodiment of a matrix processing apparatus according to this application. As shown in FIG. 14, the matrix processing apparatus provided in this embodiment includes a first determining module 1401, a second determining module 1402, and a processing module 1403. The first determining module 1401 is configured to determine a quantity of non-zero elements in a to-be-processed matrix. The to-be-processed matrix is a one-dimensional matrix. The second determining module 1402 is configured to generate a distribution matrix of the to-be-processed matrix. The distribution matrix is used to indicate a position of a non-zero element in the to-be-processed matrix. The processing module 1403 is configured to combine the quantity of non-zero elements, values of all non-zero elements in the to-be-processed matrix arranged sequentially, and the distribution matrix, to obtain a compressed matrix of the to-be-processed matrix.

The matrix processing apparatus provided in this embodiment may be configured to perform the matrix processing method shown in FIG. 1. A specific implementation and a principle that are of the matrix processing apparatus are the same as those in FIG. 1. Details are not described again.

Optionally, in the foregoing embodiment, the distribution matrix is a one-dimensional matrix, and all elements in the to-be-processed matrix have a one-to-one correspondence with elements in the distribution matrix that are in same positions as the elements in the to-be-processed matrix. The second determining module 1402 is specifically configured to: sequentially scan the to-be-processed matrix for the elements;

and when a scanned element is non-zero, set a value of an element, corresponding to the scanned element, in the distribution matrix to 1; or when a value of a scanned element is 0, set a value of the element, corresponding to the scanned element, in the distribution matrix to 0.

Optionally, in the foregoing embodiment, there are N elements in the to-be-processed matrix and M non-zero elements in the to-be-processed matrix, and correspondingly, there are N elements in the distribution matrix, M elements whose values are 1 in the distribution matrix, and (M+N+1) elements in the compressed matrix, where N is a positive integer, M is a non-negative integer, and M is less than or equal to N.

The matrix processing apparatus provided in this embodiment may be configured to perform the matrix processing method in the foregoing embodiment. A specific implementation and a principle that are of the matrix processing apparatus are the same as those in the foregoing embodiment. Details are not described again.

Figure 15:
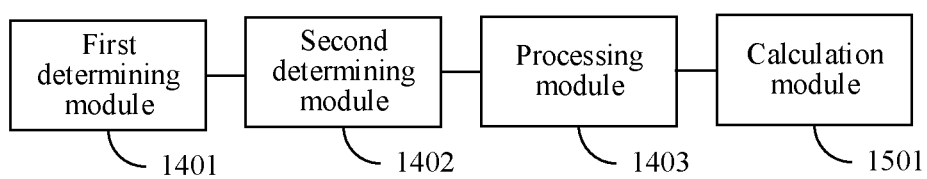
FIG. 15 is a schematic structural diagram of an embodiment of a matrix processing apparatus according to this application.

FIG. 15 is a schematic structural diagram of an embodiment of a matrix processing apparatus according to this application. As shown in FIG. 15, based on FIG. 14, the matrix processing apparatus provided in this embodiment further includes a calculation module 1501. The to-be-processed matrix in the foregoing embodiment includes a first to-be-processed matrix and a second to-be-processed matrix. A quantity of elements in the first to-be-processed matrix is the same as a quantity of elements in the second to-be-processed matrix. Correspondingly, the distribution matrix includes a first distribution matrix and a second distribution matrix. The calculation module 1501 is configured to obtain a target value based on the first distribution matrix, the second distribution matrix, non-zero elements in the first to-be-processed matrix, and non-zero elements in the second to-be-processed matrix. The target value is the same as a result of summing products of each element in the first to-be-processed matrix with an element in the second to-be-processed matrix that is in a same position as the element in the first to-be-processed matrix.

The calculation module 1501 is specifically configured to: sequentially obtain all first target elements in the second distribution matrix, to form a first mask matrix, where positions of all the first target elements in the second distribution matrix are the same as positions of all elements whose values are 1 in the first distribution matrix;

when a value of an obtained first target element is 1, use a first valid element in the non-zero element in the first to-be-processed matrix as an element in a first reduced matrix, where an arrangement order of the first valid element in the non-zero element in the first to-be-processed matrix is the same as an arrangement order of the obtained first target element in the first mask matrix;

sequentially obtain all second target elements in the first distribution matrix, to form a second mask matrix, where positions of all the second target elements in the first distribution matrix are the same as positions of all elements whose values are 1 in the second distribution matrix;

when a value of an obtained second target element is 1, use a second valid element in the non-zero element in the second to-be-processed matrix as an element in a second reduced matrix, where an arrangement order of the second valid element in the non-zero element in the second to-be-processed matrix is the same as an arrangement order of the obtained second target element in the second mask matrix; and accumulate products of elements in all positions in the first reduced matrix and elements in the second reduced matrix that are in same positions as the elements in the first reduced matrix, to obtain the target value.

The matrix processing apparatus provided in this embodiment may be configured to perform the matrix processing method shown in FIG. 6. A specific implementation and a principle that are of the matrix processing apparatus are the same as those in FIG. 6. Details are not described again.

It should be noted that, in the embodiments of this application, module division is an example, and is merely logical function division. In actual implementation, there may be another division manner. Function modules in the embodiments of this application may be integrated into one processing module, or may exist alone physically, or two or more modules may be integrated into one module. The integrated module may be implemented in a form of hardware, or may be implemented in a form of a software function module. When the integrated module is implemented in a form of a software function module and sold or used as an independent product, the integrated module may be stored in a computer readable storage medium. Based on such understanding, the technical solutions of this application essentially, or the part contributing to the prior art, or all or some of the technical solutions may be implemented in a form of a computer software product. The computer software product is stored in a storage medium and includes several instructions for instructing a computer device (which may be a personal computer, a server, a network device, or the like) or a processor to perform all or some of the steps of the methods in the embodiments of this application. The foregoing storage medium includes various media that can store program code, such as a USB flash drive, a removable hard disk, a read-only memory (ROM), a random access memory (RAM), a magnetic disk, and a compact disc.

All or some of the foregoing embodiments may be implemented by using software, hardware, firmware, or any combination thereof. When software is used to implement the embodiments, all or some of the embodiments may be implemented in a form of a computer program product. The computer program product includes one or more computer program instructions. When the computer program instructions are loaded and executed on a computer, all or some of the computer program instructions are generated based on the procedures or functions described in the embodiments of this application. The computer may be a general-purpose computer, a dedicated computer, a computer network, or another programmable apparatus. The computer instructions may be stored in a computer readable storage medium or may be transmitted from a computer readable storage medium to another computer readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk (SSD)), or the like.

This application further provides a computer readable storage medium. The computer readable storage medium stores program code, and the program code is executed to perform the matrix processing method according to any one of the foregoing embodiments.

This application further provides a computer program product. Program code included in the computer program product is executed by a processor to implement the matrix processing method according to any one of the foregoing embodiments.

Finally, it should be noted that the foregoing embodiments are merely intended to describe the technical solutions of this application, but not to limit this application. Although this application is described in detail with reference to the foregoing embodiments, persons of ordinary skill in the art should understand that they may still make modifications to the technical solutions recorded in the foregoing embodiments or make equivalent replacements to some or all technical features thereof, without departing from the scope of the technical solutions of the embodiments of this application.

What is claimed is:

1. A matrix processing method performed by a graphics processing unit (GPU), comprising:
    determining, at a processor in the GPU, a plurality of non-zero elements in a to-be-processed matrix;
    generating, at the processor, a distribution matrix of the to-be-processed matrix, wherein the distribution matrix comprises identities for indicating positions of the plurality of non-zero elements in the to-be-processed matrix;
    obtaining, at a logic circuit in the processor, a target matrix from another matrix by using the distribution matrix, wherein the target matrix consists of a plurality of target elements from the another matrix, and a position of each of the plurality of target elements in the another matrix corresponds to a position of a non-zero element in the to-be-processed matrix; and performing, at the processor, matrix processing on the plurality of non-zero elements and the target matrix to obtain an operation result.

2. The method according to claim 1, wherein the to-be-processed matrix is a multi-dimensional matrix.

3. The method according to claim 1, wherein the matrix processing comprises a multiply-add operation.

4. The method according to claim 1, wherein the to-be-processed matrix is a convolution kernel.

5. A logic circuit configured to obtain a first mask matrix and a second mask matrix using a first distribution matrix and a second distribution matrix, wherein the first distribution matrix indicates a position of a non-zero element in a first to-be-processed matrix; the second distribution matrix indicates a position of a non-zero element in a second to-be-processed matrix; the first mask matrix comprises a first target element from the second distribution matrix, wherein positions in the second distribution matrix of all first target elements from the second distribution matrix are the same as positions in the first distribution matrix of all elements whose values are 1 in the first distribution matrix; and the second mask matrix comprises a second target element from the first distribution matrix, wherein positions in the first distribution matrix of all second target elements from the first distribution matrix are the same as positions in the second distribution matrix of all elements whose values are 1 in the second distribution matrix the logic circuit comprising:

a first switch logic comprising a first input, a second input, and an output, wherein:

the first input end of the first switch logic is configured to sequentially receive elements in all positions in the second distribution matrix, the second input end of the first switch logic is configured to sequentially receive elements in the first distribution matrix that are in same positions as the received elements in the second distribution matrix, and the output end of the first switch logic is configured to output the first target element, to form the first mask matrix; and when a value of an element received by the second input end of the first switch logic is 1, the first switch logic outputs, from the output end of the first switch logic, an element received by the first input end of the first switch logic as the first target element; and a second switch logic comprising a first input, a second input, and an output, wherein:

the first input end of the second switch logic is configured to sequentially receive elements in all positions in the first distribution matrix, the second input end of the second switch logic is configured to sequentially receive elements in the second distribution matrix that are in same positions as the received elements in the first distribution matrix, and the output end of the second switch logic is configured to output the second target element, to form the second mask matrix; and when a value of an element received by the second input end of the second switch logic is 1, the second switch logic outputs, from the output end of the second switch logic, an element received by the first input end of the second switch logic as the second target element.

6. The logic circuit according to claim 5, further comprising AND gate logic, wherein a first input end of the AND gate logic is configured to sequentially receive the elements in all the positions in the first distribution matrix, a second input end of the AND gate logic is configured to sequentially receive the elements in the second distribution matrix that are in the same positions as the received elements in the first distribution matrix, and an output end of the AND gate logic is configured to output AND operation results of the first input end of the AND gate logic and the second input end of the AND gate logic to the second input end of the first switch logic and the second input end of the second switch logic.

7. The logic circuit according to claim 5, further comprising a first latch and a second latch, wherein an input end of the first latch is configured to sequentially receive the elements in all the positions in the second distribution matrix, and an output end of the first latch is configured to output an element received by the input end to the first switch logic after a first preset delay; and an input end of the second latch is configured to sequentially receive the elements in all the positions in the first distribution matrix, and an output end of the second latch is configured to output an element received by the input end to the second switch logic after a second preset delay.

8. The logic circuit according to claim 7, wherein the first preset delay is a switch turn-on delay of the first switch logic; and the second preset delay is a switch turn-on delay of the second switch logic.

9. A graphics processing unit (GPU) for matrix processing, comprising: a processor including at least a logic circuit, wherein the processor is configured to invoke programs stored in a memory coupled to the processor, to perform:

determining a plurality of non-zero elements in a to-be-processed matrix, generating a distribution matrix of the to-be-processed matrix, wherein the distribution matrix comprises identities for indicating first positions of the plurality of non-zero elements in the to-be-processed matrix; and perform matrix processing on the plurality of non-zero elements and a target matrix to obtain an operation result; and the logic circuit is further configured to: obtain the target matrix from another matrix by using the distribution matrix, wherein the target matrix consists of a plurality of target elements from the another matrix, and a position of each of the plurality of target elements in the another matrix corresponds to a position of a non-zero element in the to-be-processed matrix.

10. The apparatus according to claim 9, wherein the to-be-processed matrix is a multi-dimensional matrix.

11. The apparatus according to claim 9, wherein the matrix processing comprises a multiply-add operation.

12. The apparatus according to claim 9, wherein the to-be-processed matrix is a convolution kernel.

* * * * *